(12) United States Patent
Kim et al.

(10) Patent No.: US 12,327,822 B2
(45) Date of Patent: Jun. 10, 2025

(54) MICRO-LED DISPLAY DEVICE INCLUDING HOLES AND WIRES CONFIGURED TO IMPROVE ASSEMBLING EFFICIENCY

(71) Applicants: LG ELECTRONICS INC., Seoul (KR); LG Display Co., Ltd., Seoul (KR)

(72) Inventors: Myoungsoo Kim, Seoul (KR); Changseo Park, Seoul (KR); Minwoo Lee, Seoul (KR); Jungsub Kim, Seoul (KR)

(73) Assignees: LG ELECTRONICS INC., Seoul (KR); LG DISPLAY CO., LTD., Seoul (KR)

( * ) Notice: Subject to any disclaimer, the term of this patent is extended or adjusted under 35 U.S.C. 154(b) by 859 days.

(21) Appl. No.: 17/518,391

(22) Filed: Nov. 3, 2021

(65) Prior Publication Data
US 2023/0042942 A1    Feb. 9, 2023

(30) Foreign Application Priority Data

Aug. 6, 2021    (WO) ................ PCT/KR2021/010452

(51) Int. Cl.
*H01L 25/075*    (2006.01)
*H10H 20/857*    (2025.01)

(52) U.S. Cl.
CPC ....... *H01L 25/0753* (2013.01); *H10H 20/857* (2025.01)

(58) Field of Classification Search
CPC ... H01L 25/0753; H01L 27/156; H01L 33/38; H01L 33/62; H10H 20/857

USPC .......................................................... 257/89
See application file for complete search history.

(56) References Cited

U.S. PATENT DOCUMENTS

| | | |
|---|---|---|
| 6,536,106 B1 | 3/2003 | Jackson et al. |
| 2003/0182794 A1 | 10/2003 | Fonstad, Jr. et al. |
| 2017/0338372 A1* | 11/2017 | Teraguchi ............... H01L 33/06 |
| 2022/0254961 A1 | 8/2022 | Chang et al. |
| 2022/0319892 A1 | 10/2022 | Cho et al. |
| 2022/0328335 A1* | 10/2022 | Shim ....................... H01L 21/68 |
| 2022/0351993 A1 | 11/2022 | Jeong et al. |
| 2022/0378915 A1 | 11/2022 | Kim et al. |
| 2022/0393071 A1 | 12/2022 | Moon et al. |
| 2022/0415859 A1 | 12/2022 | Chol et al. |
| 2023/0119882 A1 | 4/2023 | Kim et al. |

FOREIGN PATENT DOCUMENTS

| | | |
|---|---|---|
| KR | 10-2019-0126200 A | 11/2018 |
| KR | 10-2019-0085892 A | 7/2019 |
| KR | 10-2019-0104276 A | 9/2019 |
| KR | 10-2019-0104277 A | 9/2019 |

(Continued)

*Primary Examiner* — Matthew E. Gordon
(74) *Attorney, Agent, or Firm* — Birch, Stewart, Kolasch & Birch, LLP

(57) ABSTRACT

Discussed is a display device including a substrate, a plurality of first assembling wires on the substrate, a plurality of second assembling wires on the substrate, and separated from the plurality of first assembling wires; a first insulating layer disposed on the substrate, wherein a first hole is located on each of the plurality of second assembling wires, respectively, and wherein the first hole is not located on each of the plurality of first assembling wires; and a semiconductor light emitting device in the first hole.

19 Claims, 21 Drawing Sheets

(56) References Cited

FOREIGN PATENT DOCUMENTS

| KR | 10-2020-0026681 A | | 3/2020 | | |
|----|-------------------|---|--------|---|---|
| KR | 10-2020-0026683 A | | 3/2020 | | |
| KR | 10-2020-0026702 A | | 3/2020 | | |
| KR | 10-2020-0026845 A | | 3/2020 | | |
| KR | 10-2020-0030514 A | | 3/2020 | | |
| KR | 20200026683 A | * | 3/2020 | ........... | H01L 33/005 |
| KR | 10-2020-0099037 A | | 8/2020 | | |
| KR | 10-2021-0055831 A | | 5/2021 | | |

* cited by examiner

MICRO-LED DISPLAY DEVICE INCLUDING HOLES AND WIRES CONFIGURED TO IMPROVE ASSEMBLING EFFICIENCY

CROSS-REFERENCE TO RELATED APPLICATIONS

This Application claims the benefit under 35 U.S.C. § 119(a) to International Application No. PCT/KR2021/010452, filed on Aug. 6, 2021, the contents of which are hereby incorporated by reference herein in their entirety.

BACKGROUND

The embodiment relates to a display device.

A display device displays a high-quality image using a self-emissive device, such as a light emitting diode, as a light source of a pixel. The light emitting diode, which may represent excellent durability, a longer lifespan, and higher brightness under the inferior conditions, has been spotlighted as a light source of a next generation display device.

Recently, studies and researches have been performed on manufacturing an ultra-small light emitting diode using a material having an inorganic crystal structure having higher reliability, on disposing the ultra-small light emitting diode on a panel (hereinafter, referred to as a "display panel") of a display device, and on employing the ultra-small light emitting diode as a next-generation light source.

Such a display device has been expanded to various types of displays, such as a flexible display, a foldable display, a stretchable display, or a rollable display, beyond a flat panel display.

To realize higher resolution, the size of a pixel is gradually reduced. A light emitting device has to be aligned to numerous pixels having reduced sizes. Accordingly, studies and researches have been actively performed on manufacturing an ultra-small light emitting diode reduced to be in a micro-size or a nano-scale.

In general, a display device includes at least tens of millions of pixels. Accordingly, since it is difficult to align the at least one light emitting device in each of tens of millions of pixels, recently, various studies and researches have been actively performed on a technique of aligning light emitting devices in the display panel.

As the size of the light emitting device is reduced, the most important issue is to rapidly and exactly transfer the light emitting device onto a substrate. The transferring technology, which has been recently developed, includes a pick and place process, a laser lift-off method, or a self-assembly method. In particular, the self-assembly method of transferring a light emitting device onto a substrate by using a magnetic substance (or a magnet) has been recently spotlighted.

According to the self-assembly method, numerous light emitting devices are introduced into a bath having a fluid to move to pixels of the substrate, as to magnetic substance moves, such that the light emitting device is aligned to each pixel.

Accordingly, the self-assembly method has been as a next-generation transferring method, as numerous light emitting devices are rapidly and exactly transferred onto the substrate.

As illustrated in FIG. 1, assembling wires 2 and 3 are disposed on a substrate 1, and an assembling hole 6 may be provided in a barrier 5 on the assembling wires 2 and 3. As a magnetic substance moves, light emitting devices 6 and 7 included in the fluid move. An electric field is generated between the assembling wires 2 and 3 as a voltage is applied to the assembling wires 2 and 3. The light emitting devices 6 and 7 are assembled to the assembling hole 6 by dielectrophoretic force formed by the electric field.

Meanwhile, as illustrated in FIGS. 1 and 3, the strength of the electric field is varied in a Z-axis direction in the assembling hole 6. Typically, when an electric field is significantly strongly generated at position "a" corresponding to a bottom part of the assembling hole 6, and is weak or absent at remaining positions, that is, position "b" and position "c", a light emitting device may be assembled to the assembling hole 6. Position "a" is the bottom part of the assembling hole 6, position "b" corresponds to the top surface of a barrier 5, and position "c" correspond to a specific height "h" from the top surface of the barrier 5.

Typically, the assembling hole 6 is provided to be assembled with one light emitting device.

However, when an electric field having the remarkable strength is present at position "b" and position "c" and when a light emitting device 8, which is not matched with the assembling hole 6, is first assembled to the assembling hole 6, a light emitting device 7 matched with the assembling hole 6 is not assembled to the assembling hole 6 because the light emitting device 8 already assembled to the assembling hole 6 blocks the light emitting device 7 from being assembled to the assembling hole 6, thereby degrading the assembling efficiency. In other words, when the light emitting device 8 has been already assembled into the assembling hole 6, stronger dielectrophoretic force is applied from the lower most portion to the upper most portion of the light emitting device 8, so the light emitting device 8 is not detached. Therefore, the light emitting device 7 matched with the assembling hole 6 is completely blocked from being assembled to the assembling hole 6 due to the light emitting device 8 assembled with the assembling hole 6.

In addition, since an electric field having the relatively strong strength is present even at position "b" and position "c" in the assembling hole 6, even the light emitting device 7 is partially assembled to the assembling hole 6 without being detached, by the dielectrophoretic force formed by the electric field. That is, the light emitting device 7 makes contact with an upper portion of the light emitting device 8, so at least two light emitting devices 7 and 8 are repeatedly assembled to one assembling hole 6, thereby causing the assembling failure. As described above, when the light emitting devices are repeatedly assembled, the light emitting devices are severely wasted, and the manufacturing costs are increased. When the light emitting device 7 repeatedly assembled at the upper portion is detached in the following process, another failure may be caused.

Meanwhile, as illustrated in FIG. 2, even if the light emitting device 7 is correctly assembled to the assembling hole 6, the diameter of the assembling hole 6 is greater than that of the light emitting device 7. Accordingly, a tolerance 9 is formed between the light emitting device 7 and an inner part of the assembling hole 6. In this case, since an electric filed is formed through the tolerance 9, the light emitting device around the tolerance 9 is fixed to a peripheral portion of the tolerance 9 by receiving the dielectrophoretic force formed by the electric field in the tolerance 9. Accordingly, at least two light emitting devices are assembled to the assembling hole 6.

SUMMARY

The embodiment is to solve the above described problems or other problems.

The embodiment is to provide a display device capable of preventing an assembling failure.

The embodiment is to provide a display device capable of improving an assembling efficiency.

The technical problems to be solved by the embodiment are not limited to the aforementioned problems, and any other technical problems not mentioned herein will be clearly understood from the following description by those skilled in the art to which the present disclosure pertains.

According to the embodiment, a display device includes a substrate, a plurality of first assembling wires on the substrate, a plurality of second assembling wires on the substrate, a first insulating layer disposed on the substrate and having a first hole on a top surface of each of the plurality of second assembling wires, and a semiconductor light emitting device in the first hole.

The display device may include a second insulating layer disposed on the first insulating layer and the plurality of second assembling wires, and having at least two second holes.

The second hole may have a diameter less than a second width of each of the plurality of second assembling wires.

The second hole may have a diameter less than a diameter of the semiconductor light emitting device.

The at least two second holes may be positioned in the first hole.

At least four second holes may be formed in the second insulating layer in the second hole, along an edge of the first hole, when the first hole has a circular shape.

At least two second holes may be formed in the second insulating layer in the second hole, to face each other in a direction of a major axis of the first hole, when the first hole has an oval shape.

The at least two second holes may make contact with a bottom surface of the semiconductor light emitting device.

The first assembling wire may make contact with the second insulating layer.

The embodiment may improve the assembling efficiency.

Typically, as an assembling hole is provided on a region corresponding to the space between two assembling wires, the light emitting device is assembled to the assembling hole by dielectrophoretic force formed between the assembling wires.

Since the assembling hole is provided on the region corresponding to the space between the two assembling wires, the strength of the electric field formed between two assembling wires is not significantly varied in a vertical direction (Z-axis direction) in the assembling hole. In other words, the great difference is not made among the strength of the electric field at the bottom part of the assembling hole, the strength of the electric field at the upper portion of the assembling hole, and the strength of the electric field above the upper portion of the assembling hole. Accordingly, even if another light emitting device not matched with the assembling hole is positioned at the upper portion of the assembling hole, the another light emitting device is assembled to the assembling hole. In addition, the another light emitting device assembled in the assembling hole is not detached because the electric field represents the strongest strength at the bottom part of the assembling hole. Accordingly, when the another light emitting device not matched with the assembling hole is assembled to the assembling hole, the light emitting device matched with the assembling hole is not assembled to the assembling hole due to the another light emitting device which is assembled to the assembling hole and not detached from the assembling hole.

To solve the above problem, according to the embodiment, the strength of the electric filed is rapidly varied in the vertical direction in the assembling hole. In other words, the electric field represents the strongest strength at the bottom part in the assembling hole, and the strength of the electric field is rapidly reduced in a direction of being away upward from the bottom part in the assembling hole, that is, in an upward direction. Accordingly, the strength of the electric field is absent or weak at the upper portion of the assembling hole.

In detail, according to the embodiment, the assembling hole, that is, a first hole, is provided on a second assembling wire of a first assembling wire and the second assembling wire. Accordingly, the strength of the electric field may be rapidly reduced in the vertical direction in the first hole on the second assembling wire.

Accordingly, even if another light emitting device not matched with the assembling hole is positioned at the upper portion of the assembling hole, since the strength of the electric field is absent or weak at the upper portion of the assembling hole, the another light emitting device is not assembled to the assembling hole. Even if the another light emitting device is assembled to the assembling hole, since the shape of the another light emitting device is different from the shape of the assembling hole, the another light emitting device may be inclined and assembled without being completely assembled into the assembling hole. In this case, the electric field is absent at the upper portion of the assembling hole. Force of fixing the another light emitting device inclined and assembled to the assembling hole is not generated. The another light emitting device may be easily detached from the assembling hole.

Accordingly, the light emitting device matched with the assembling hole is assembled to the assembling hole. Thus, the assembling efficiency may be improved.

Meanwhile, the embodiment may prevent the assembling failure.

The light emitting device matched with the assembling hole is made in a size less than a diameter of the assembling hole such that the semiconductor light emitting device may be easily assembled in the assembling hole. Accordingly, when the semiconductor light emitting device is assembled in the assembling hole, the tolerance may be generated between the inner part of the assembling hole and the semiconductor light emitting device. Such a tolerance may be more increased when the light emitting device is tilted to one side in the assembling hole.

Conventionally, since the difference in the strength of the electric field in the vertical direction is not great in the assembling hole, when the electric field having the stronger strength is present at the upper portion of the assembling hole, the electric field having the stronger strength is present through the tolerance. Accordingly, even if the semiconductor light emitting device is assembled to the assembling hole, another semiconductor light emitting device may make contact with the upper portion of the semiconductor light emitting device assembled to the assembling hole by the electric field in the tolerance. Therefore, at least two semiconductor light emitting devices are repeatedly assembled to the assembling hole, thereby causing the assembling failure.

To solve the above problem, the strength of the electric filed is rapidly varied in the vertical direction in the assembling hole. In other words, the electric field having the strongest strength is generated at the bottom part in the assembling hole, and the strength of the electric field is rapidly reduced in the direction of being away upward from the bottom part in the assembling hole, that is, in the upper direction. The strength of the electric field is weak or absent at the upper portion of the assembling hole.

Accordingly, even if the semiconductor light emitting device matched with the assembling hole is assembled in the assembling hole and the tolerance is formed between the inner part of the assembling hole and the semiconductor light emitting device, since the strength of the electric field is weak or absent at the upper portion of the assembling hole, another semiconductor light emitting device is not repeatedly assembled onto the semiconductor light emitting device already assembled to the assembling hole, thereby preventing the assembling failure.

Meanwhile, according to the embodiment, since the interval between the first assembling wire and the second assembling wire is formed to be significantly greater than at least the diameter of the semiconductor light emitting device, thereby reducing a capacitance. In this case, when a signal is applied to the data wire and the common data wire to emit light from the semiconductor light emitting device, the distortion of the signal is minimized, such that the desired brightness is exactly obtained from the semiconductor light emitting device. Accordingly, the image quality may be improved.

The additional scope of the applicability of the embodiment can be apparent from the following detailed description. However, since variations and modifications of the technical spirit and the technical scope of the embodiment can be understood by those skilled in the art, the detailed description and embodiments are provided on for the illustrative purpose.

DETAILED DESCRIPTION OF THE EMBODIMENTS

Figure 1:
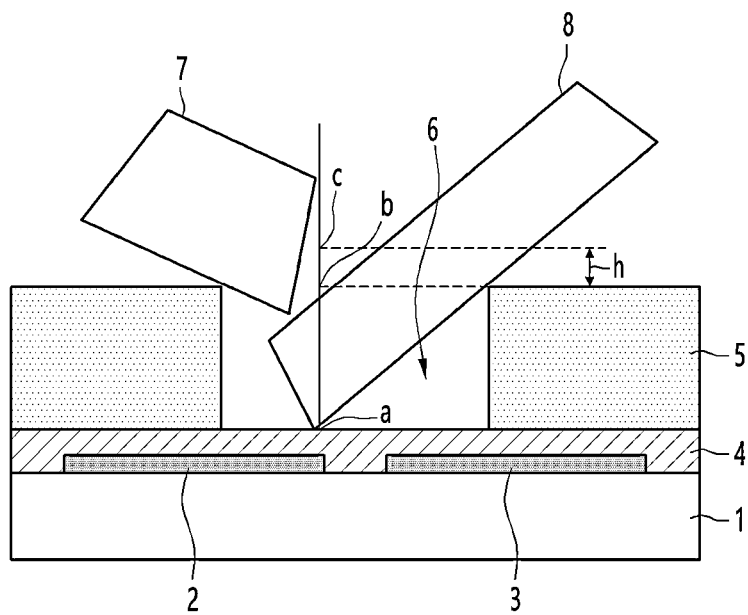
FIG. 1 shows two semiconductor light emitting devices assembled to an assembling hole.

Hereinafter, embodiments disclosed in the present disclosure will be described with reference to accompanying drawings, same or similar components will be assigned with same reference numerals, and the redundant repeat thereof will be omitted. Suffixes of components, such as "module" and "unit", which are employed in the following description, are merely intended to facilitate description of the specification, and the suffix itself is not intended to give any special meaning or function. In addition, accompanying drawings are provided for the illustrative purpose, and the technical spirit of the present disclosure is not limited to the accompanying drawings. In addition, it will be understood that, when a layer, a region, or a substrate is referred to as being "on" another layer, another region, or another substrate, it can be "directly" or "indirectly" on the other layer, region, or substrate, or one or more intervening layers may also be present.

The display device in the present disclosure may include a cellular phone, a smart phone, a laptop computer, a digital-broadcasting terminal, personal digital assistances (PDA), a portable multimedia player layer (PMP), a navigation, a slate, a personal computer (PC), a tablet PC, an ultra-book, a digital TV, or a desktop computer. However, the configuration of the embodiment of the present disclosure is applicable to a device having a display function, in even a new product developed thereafter.

Hereinafter, a light emitting device according to the embodiment and a display device including the same will be described.

Figure 4:
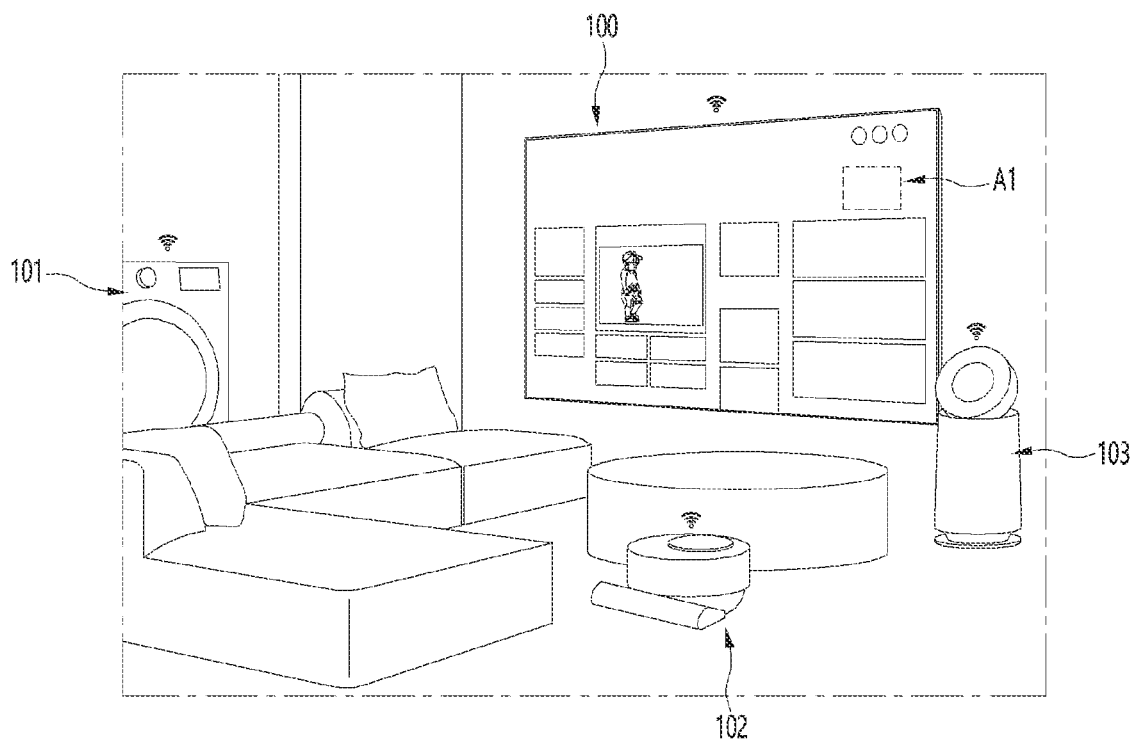
FIG. 4 illustrates the living room of a house in which a display device is disposed according to an embodiment.

FIG. 4 illustrates a living room of a house, in which a display device is disposed, according to the embodiment.

Referring to FIG. 4, according to the embodiment, a display device 100 may display the status of various electronic devices, such as a washing machine 101, a robot cleaner 102, or an air purifier 103, may make communication with various electronic products based on Internet of Things (IOT), and may control various electronic products based on the setting data of a user.

According to the embodiment, the display device 100 may include a flexible display manufactured on a thin and flexible substrate. The flexible display may maintain the characteristic of an existing flat panel display, and may be bendable and rollable, like paper.

Visible information in the flexible display device may be realized by independently controlling the emitting of light from unit pixels arranged in the form of a matrix. The unit pixel is the minimum pixel to realize one color. The unit pixel of the flexible display device may be realized with a light emitting device. According to an embodiment, the light emitting device may include, but is not limited to, a micro-LED or a nano-LED.

Figure 5:
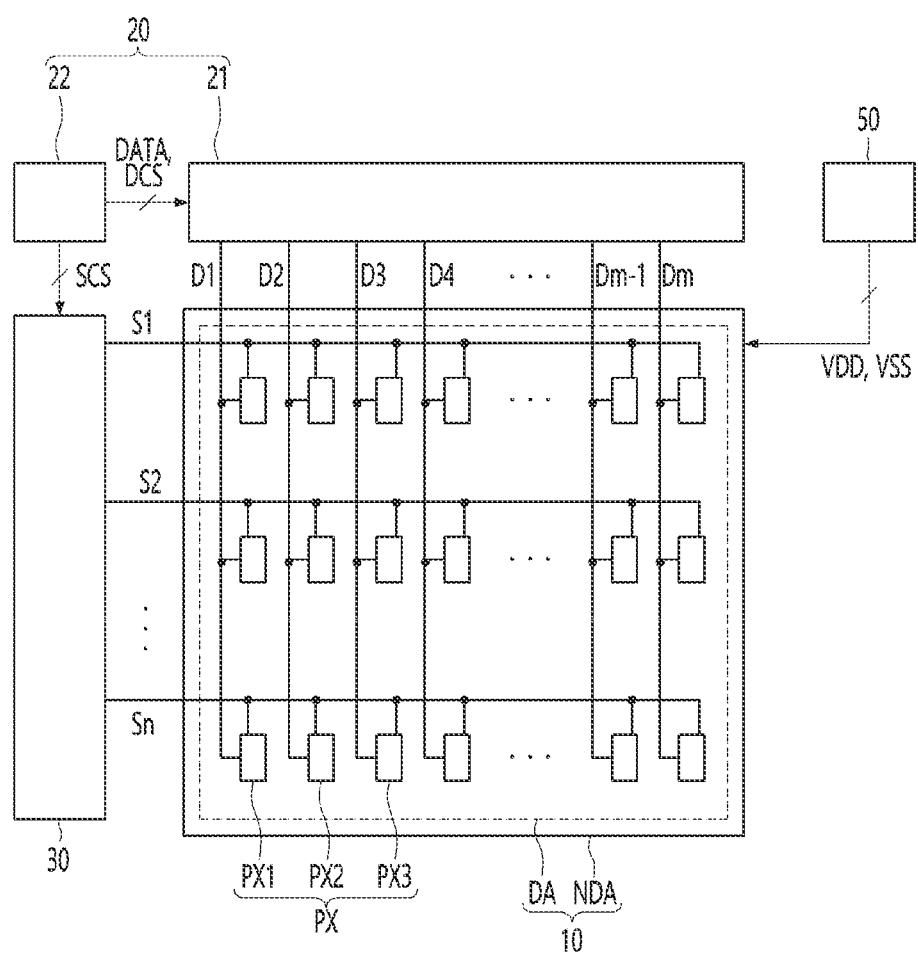
FIG. 5 is a block diagram schematically illustrating a display device according to an embodiment.
Figure 6:
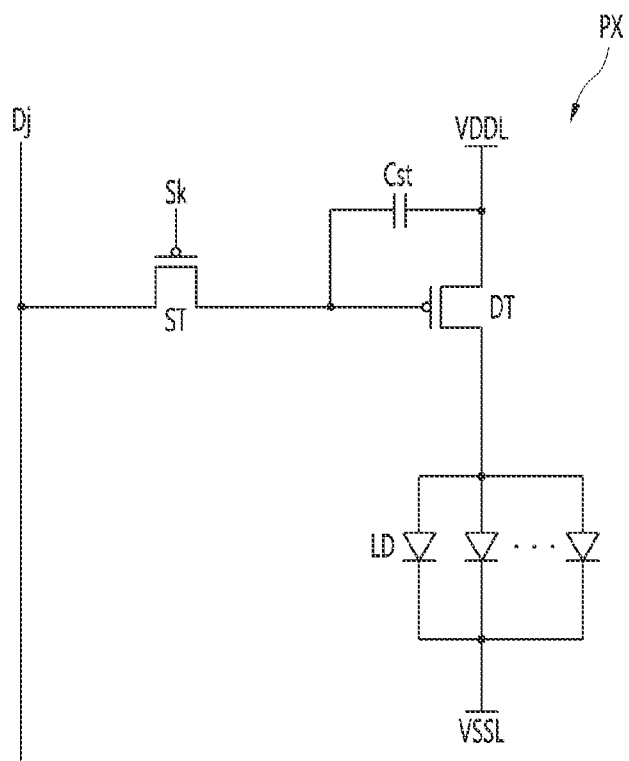
FIG. 6 is a circuit diagram illustrating a pixel of FIG. 5.

FIG. 5 is a block diagram schematically illustrating a display device according to the embodiment, and FIG. 6 is a circuit diagram illustrating a pixel of FIG. 5.

Referring to FIGS. 5 and 6, according to the embodiment, the display device 100 may include a display panel 10, a driving circuit 20, a scan driver 30, and a power supply circuit 50.

According to an embodiment, the display device 100 may drive the light emitting device in an active matrix (AM) manner or a passive matrix (PM) manner.

The driving circuit 20 may include a data driver 21 and a timing controller 22.

The display panel 10 may have, but is not limited to, the shape of a rectangle. In other words, the display panel 10 may be formed in a circular shape or an oval shape. At least one side of the display panel 10 may be formed to be bent with a specific curvature.

The display panel 10 may be divided into a display region DA and a non-display region NDA disposed at a peripheral portion of the display region DA. The display region DA has pixels PX formed therein to display an image. The display panel 10 may include data lines D1-Dm (m is an integer value equal to or greater than 2), scan lines S1-Sn (n is an integer value equal to or greater than 2) crossing the data lines D1-Dm, a high-potential voltage line to supply a high-potential voltage, a low-potential voltage line to supply a low-potential voltage, and pixels PX connected with the data lines D1-Dm and the scan lines S1-Sn.

Each pixel PX may include a first sub-pixel PX1, a second sub-pixel PX2, and a third sub-pixel PX3. The first sub-pixel PX1 may emit first color light having a first main wavelength, the second sub-pixel PX2 may emit second color light having a second main wavelength, and the third sub-pixel PX3 may emit third color light having a third main wavelength. The first color light may be red light, the second color light may be green light, and the third color light may be blue light, but the embodiment is not limited thereto. In addition, although FIG. 5 illustrates that each pixel PX includes three sub-pixels, the embodiment is not limited thereto. In other words, each pixel PX may include at least four sub-pixels.

Each of the first sub-pixel PX1, the second sub-pixel PX2, and the third sub-pixel PX3 may be connected with at least one of the data lines D1-Dm, at least one of the scan lines S1-Sn, and the high-potential voltage line, respectively. The first sub-pixel PX1 may include light emitting devices LD, a plurality of transistors to supply currents to the light emitting devices LD, and at least one capacitor Cst, as illustrated in FIG. 6.

Although not illustrated in the drawings, each of the first sub-pixel PX1, the second sub-pixel PX2, and the third sub-pixel PX3 may include only one light emitting device LD and at least one capacitor Cst.

Each of light emitting devices LD may be a semiconductor light emitting diode including a first electrode, a plurality of conductive semiconductor layers, and a second electrode. In this case, the first electrode may be an anode electrode, and the second electrode may be a cathode electrode, but the embodiment is not limited thereto.

The light emitting device may be one of a lateral-type light emitting device, a flipchip-type light emitting device, and a vertical-type light emitting device.

A plurality of transistors may include a driving transistor DT to supply a current to the light emitting devices LD and a scan transistor ST to supply a data voltage to a gate electrode of the driving transistor DT, as illustrated in FIG. 6. The driving transistor DT may include a gate electrode connected with a source electrode of the scan transistor ST, a source electrode connected with a high-potential voltage line to which a high-potential voltage is applied, and a drain electrode connected with first electrodes of the light emitting devices LD. The scan transistor ST may include a gate electrode connected with a scan line Sk (k is an integer value satisfying $1 \leq k \leq n$), the source electrode connected with the gate electrode of the driving transistor DT, and a drain electrode connected with a data line Dj (j is an integer value satisfying $1 \leq j \leq m$).

The storage capacitor Cst is formed between the gate electrode and the source electrode of the driving transistor DT. The storage capacitor Cst is charged with the difference between a gate voltage and a source voltage of the driving transistor DT.

The driving transistor DT and the scan transistor ST may be formed with thin film transistors. In addition, the above description has been made with reference to FIG. 6 while focusing on that the driving transistor DT and the scan transistor ST are realized with p-type metal oxide semiconductor field effect transistors (MOSFET), but the embodiment is not limited thereto. The driving transistor DT and the scan transistor ST may be realized with an N-type MOSFET. In this case, the positions of a source electrode and a drain electrode may be changed in each of the driving transistor DT and the scan transistor ST.

In addition, in FIG. 6, each of the first sub-pixel PX1, the second sub-pixel PX2, the third sub-pixel PX3 has a 2 transistor 1 capacitor (2T1C) structure having one driving transistor DT, one scan transistor ST, and one capacitor Cst, but the embodiment is not limited thereto. Each of the first sub-pixel PX1, the second sub-pixel PX2, the third sub-pixel PX3 may include a plurality of scan transistors ST and a plurality of storage capacitors Cst.

Since the second sub-pixel PX2 and the third sub-pixel PX3 are expressed in the substantially same circuit diagram as that of the first sub-pixel PX1, the details thereof will be omitted below.

The driving circuit 20 outputs signals and voltages for driving the display panel 10. The driving circuit 20 may include the data driver 21 and the timing controller 22.

The data driver 21 receives digital video data DATA and a source control signal DCS from the timing controller 22. The data driver 21 converts the digital video data DATA into analog data voltages in response to the source control signal DCS and supplies the analog data voltages to the data lines D1-Dm of the display panel 10.

The timing controller 21 receives the digital video data DATA and timing signals from a host system. The timing signals may include a vertical sync signal, a horizontal sync signal, a data enable signal, and a dot clock. The host system may be an application processor of a smartphone or a tablet PC, a monitor, or a system on chip of a television (TV).

The timing controller 22 generates control signals for controlling the operating timing of the data driver 21 and the scan driver 30. The control signals may include a source control signal DCS for controlling the operating timing of the data driver 21 and a scan control signal SCS for controlling the operating timing of the scan driver 30.

The driving circuit 20 may be disposed in the non-display region NDA provided at one side of the display panel 10. The driving circuit 20 may be provided in the form of an integrated circuit (IC), and may be mounted in a chip on glass (COG) manner, a chip on plastic (COP) manner, or an ultrasonic wave bonding manner on the display panel 10, but the embodiment is not limited thereto. For example, the driving circuit 20 may be mounted on a circuit board (not illustrated) instead of the display panel 10.

The data driver 21 may be mounted on in a chip on glass (COG) manner, a chip on plastic (COP) manner, or an ultrasonic wave bonding manner on the display panel 10, and the timing controller 21 may be mounted on the circuit board.

The scan driver 30 receives a scan control signal SCS from the timing controller 22. The scan driver 30 generate scan signals in response to the scan control signal SCS and supplies the scan signals to the scan lines S1-Sn of the display panel 10. The scan driver 30, which includes a plurality of transistors, may be formed in the non-display region NDA of the display panel 10. Alternatively, the scan driver 30 may be provided in the form of the IC. In this case, the scan driver 30 may be mounted on a flexible gate film attached to another side of the display panel 10.

The circuit board may be attached onto pads provided at one edge of the display panel 10 using an anisotropic conductive film. Due to this, lead lines of the circuit board may be electrically connected with pads. The circuit board may be a flexible film such as a flexible printed circuit board, a printed circuit board, or a chip on film. The circuit board may be bent under the display panel 10. Due to this, one side of the circuit board may be attached to one edge of the display panel 10, and an opposite side of the circuit board may be disposed under the display panel 10 and connected with a system board on which the host system is mounted.

A power supply circuit 50 may generate voltages necessary for driving the display panel 10, based on main power applied from the system board and may apply the voltages to the display panel 10. For example, the power supply circuit 50 may generate a high-potential voltage VDD and a low-potential voltage VSS for driving the light emitting devices LD of the display panel 10, based on the main power, and may supply the high-potential voltage VDD and the low-potential voltage VSS to the high-potential voltage line and the low-potential voltage line of the display panel 10. In addition, the power supply circuit 50 may generate driving voltages for driving the driving circuit 20 and the scan driver 30, based on the main power, and may supply the driving voltages to the driving circuit 20 and the scan driver 30.

Figure 7:
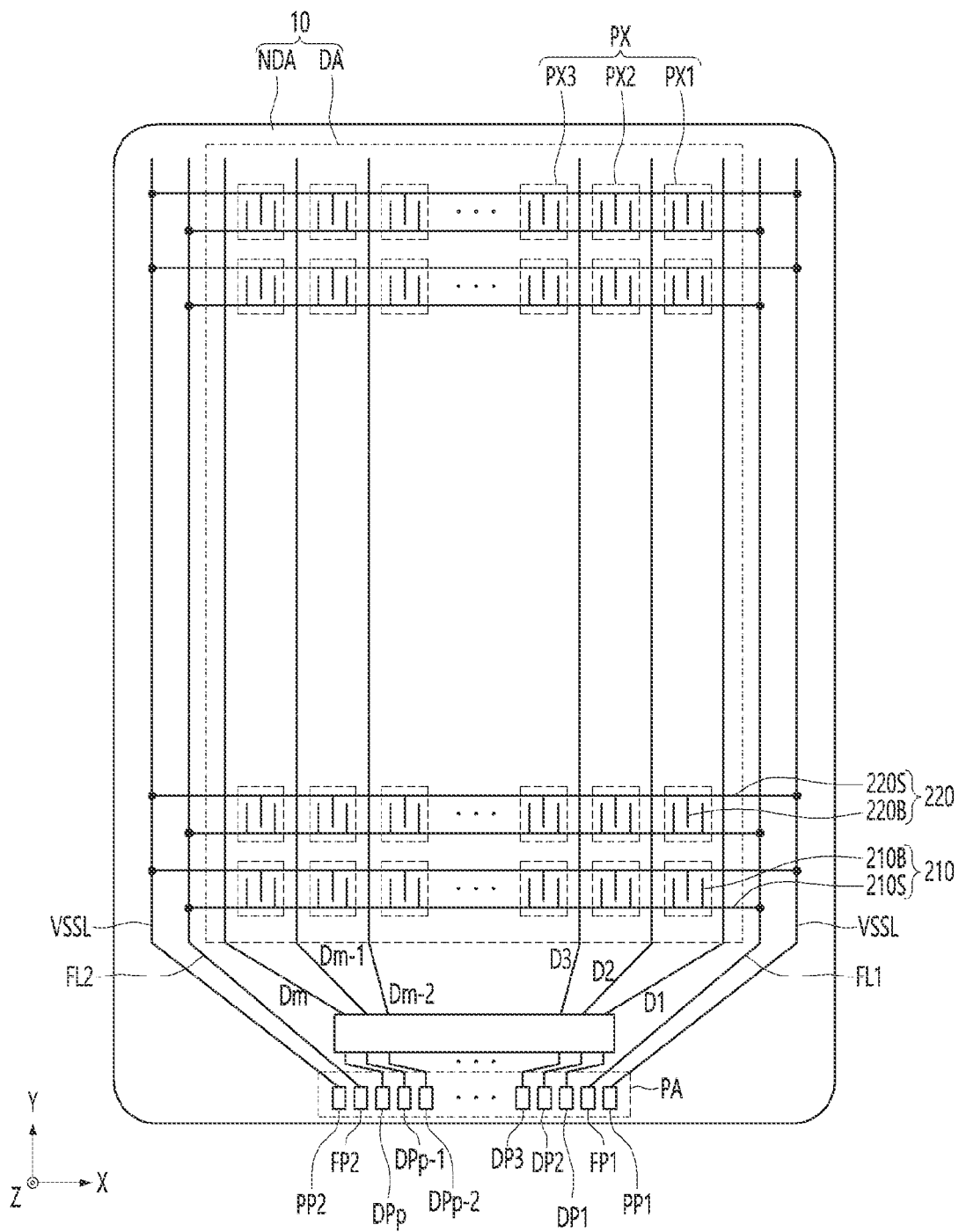
FIG. 7 is a plan view illustrating a display panel of FIG. 5 in detail.

FIG. 7 is a plan view illustrating the display panel of FIG. 5, in detail. FIG. 7 illustrates only data pads DP1-DPp (p is an integer value equal to or greater than 2), floating pads FP1 and FP2, power pads PP1 and PP2, floating lines FL1 and FL2, a low-potential voltage line VSSL, data lines D1-Dm, first pad electrodes 210, and second pad electrodes 220, for the convenience of explanation.

Referring to FIG. 7, the data lines D1-Dm, the first pad electrodes 210, the second pad electrodes 220, and pixels PX may be disposed in the display region DA of the display panel 10.

The data lines D1-Dm may longitudinally extend in a second direction (a Y-axis direction). One sides of the data lines D1-Dm may be connected with the driving circuit 20 (see reference numeral 20 of FIG. 5). Due to this, data voltages of the driving circuit 20 may be applied to the data lines D1-Dm.

The first pad electrodes 210 may be spaced apart from each other by a specific distance in a first direction (an X-axis direction), and can have a stem 210S and a branch 210B. Due to this, the first pad electrodes 210 may not overlap the data lines D1-Dm. Some first pad electrodes 210, which are disposed at a right edge of the display region DA, of the first pad electrodes 210, may be connected with the first floating line FL1 in the non-display region NDA. Some first pad electrodes 210, which are disposed at a left edge of the display region DA, of the first pad electrodes 210, may be connected with the second floating line FL2 in the non-display region NDA.

Each of the second pad electrodes 220 may longitudinally extend in the first direction (an X-axis direction) and can have a stem 220S and a branch 220B. Due to this, the second pad electrodes 220 may overlap the data lines D1-Dm. Alternatively, the second pad electrodes 220 may be connected with the low-potential voltage line VSSL in the non-display region NDA. Due to this, a low-potential voltage of the low-potential line VSSL may be applied to the second pad electrodes 220.

The pad part PA, the driving circuit 20, the floating line FL1, the second floating line FL2, and the lower-potential voltage line VSSL may be disposed in the non-display region NDA of the display panel 10. The pad part PA may include the data pads DP1-DPp, the floating pads FP1 and FP2, and the power pads PP1 and PP2.

The pad part PA may be disposed at one edge, for example, a lower edge of the display panel 10. The data pads DP1-DPp, the floating pads FP1 and FP2, and the power pads PP1 and PP2 may be arranged in parallel to each other in the first direction (the X-axis direction).

The circuit board may be attached onto the data pads DP1-DPp, the floating pads FP1 and FP2, and the power pads PP1 and PP2 using an anisotropic conductive film. Due to this, the circuit board may be electrically connected with the data pads DP1-DPp, the floating pads FP1 and FP2, and the power pads PP1 and PP2.

The driving circuit 20 may be connected with the data pads DP1-DPp through link lines. The driving circuit 20 may receive the digital video data DATA and the timing signals through the data pads DP1-DPp. The driving circuit 20 may convert the digital video data DATA into the analog data voltages and may supply the analog data voltages to the data lines D1-Dm of the display panel 10.

Low-potential voltage lines VSSL may be connected with the first power pad PP1 and the second power pad PP2 of the pad part PA. The low-potential voltage lines VSSL may longitudinally extend in the second direction (the Y-axis direction) in portions of the non-display region NDA, which are positioned at a left outer portion and a right outer portion of the display region DA. The low-potential voltage line VSSL may be connected with the second pad electrodes 220. Due to this, the low-potential voltage of the power supply circuit 50 may be applied to the second pad electrodes 220 through the circuit board, the first power pad PP1, the second power pad PP2, and the low-potential voltage line VSSL.

The first floating line FL1 may be connected with the first floating pad FP1 of the pad part PA. The first floating line FL1 may longitudinally extend in the second direction (the Y-axis direction) in portions of the non-display region NDA, which are positioned at the left outer portion and the right outer portion of the display region DA. The first floating pad FP1 and the first floating line FL1 may be a dummy pad and a dummy line having no voltage applied thereto.

The second floating line FL2 may be connected with the second floating pad FP2 of the pad part PA. The second floating line FL2may longitudinally extend in the second direction (the Y-axis direction) in portions of the non-display region NDA, which are positioned at the left outer portion and the right outer portion of the display region DA. The second floating pad FP2 and the second floating line FL2 may be a dummy pad and a dummy line having no voltage applied thereto.

Meanwhile, since the light emitting devices (see reference sign LD of FIG. 6) have significantly small sizes, the mounting of the light emitting devices LD in the first sub-pixel PX1, the second sub-pixel PX2, and the third sub-pixel PX3 of each pixel PX may be significantly difficult.

To solve the above problem, an alignment technique based on a dielectrophoresis manner has been suggested.

In other words, an electric field may be formed in the first sub-pixel PX1, the second sub-pixel PX2, and the third sub-pixel PX3 of each pixel PX to align the light emitting devices (see reference numeral 150 of FIG. 8) in the manufacturing process of the display panel 10. In addition, the light emitting devices (see reference numeral 150 of FIG. 8) may be aligned in the first sub-pixel PX1, the second sub-pixel PX2, and the third sub-pixel PX3 by applying dielectrophoretic force to light emitting devices (see reference numeral 150 of FIG. 8) through a dielectrophoresis manner during the manufacturing process.

However, the ground voltage may not be applied to the first pad electrodes 210 by driving thin film transistors during the manufacturing process Accordingly, although the first pad electrodes 210 are spaced apart from each other by a specific distance in the first direction (the X-axis direction) in the manufactured display device, the first pad electrodes 210 may longitudinally extend without disconnected in the first direction (the X-axis direction).

Due to this, the first pad electrodes 210 may be connected with the first floating line FL1 and the second floating line FL2 during the manufacturing process. Accordingly, the first pad electrodes 210 may receive the ground voltage through the first floating line FL1 and the second floating line FL2. The first pad electrodes 210 may be spaced apart from each other by a specific distance in the first direction (the X-axis direction) by disconnecting the first pad electrodes 210 after aligning the light emitting devices (see reference numeral 150 of FIG. 8) using the dielectrophoresis manner during the manufacturing process.

Meanwhile, the first floating line FL1 and the second floating line FL2 are lines for applying the ground voltage during the manufacturing process. However, any voltage is not applied in the manufactured display device. The ground voltage may be applied to the first floating line FL1 and the second floating line FL2 to prevent static electricity or to drive the light emitting device (see reference numeral 150 of FIG. 8) in the c manufactured display device.

Figure 3:
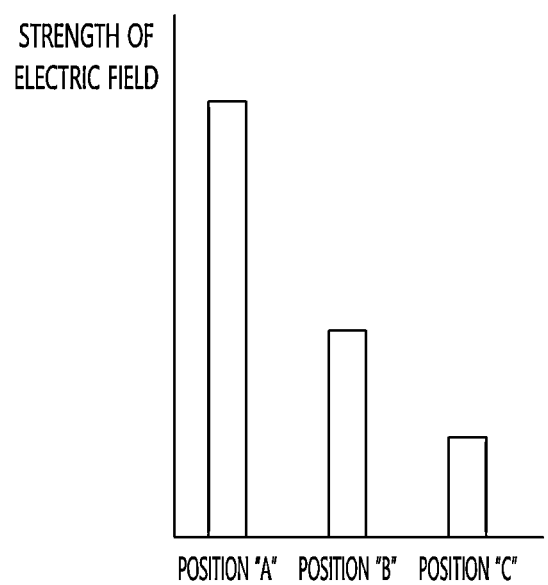
FIG. 3 shows the strength of an electric field in a vertical direction in the assembling hole of FIG. 1.
Figure 8:
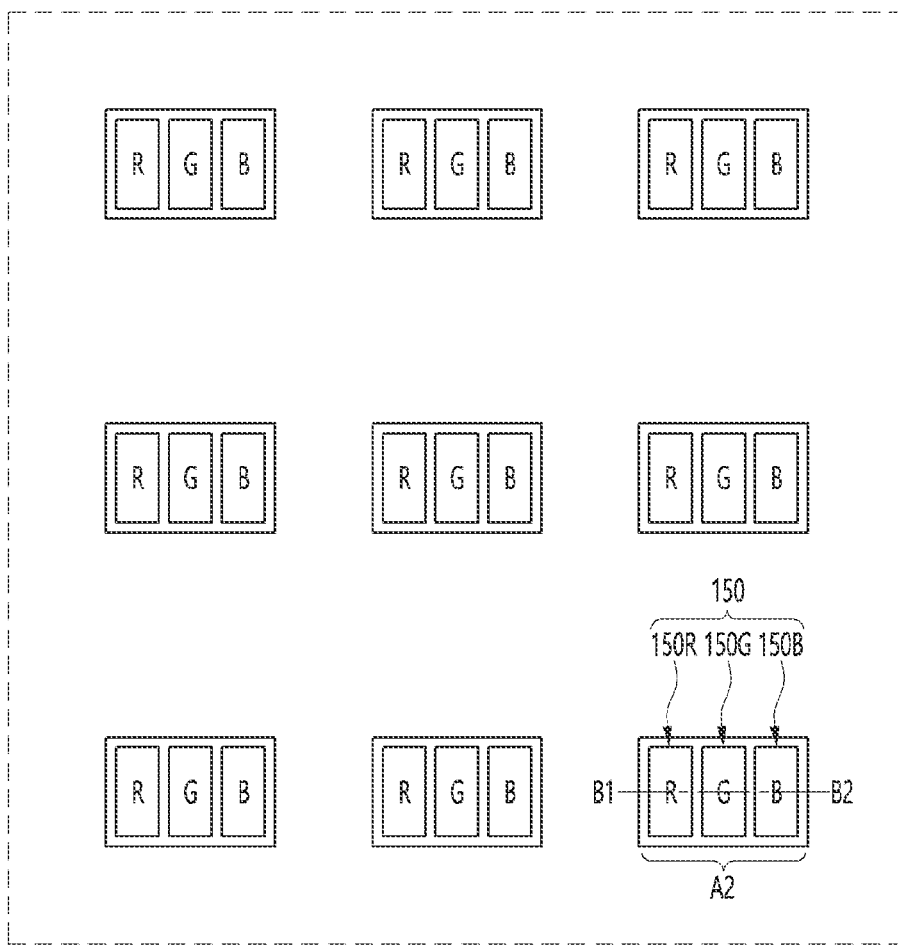
FIG. 8 is an expanded view of a first panel region in a display device of FIG. 4.

FIG. 8 is an expanded view of a first panel region in the display device of FIG. 3.

Referring to FIG. 8, according to the embodiment, the display device 100 manufactured, as a plurality of panel regions, such as a first panel region A1, are mechanically or electrically connected with each other through tiling.

The first panel region A1 may include a plurality of light emitting devices 150 arranged according to unit pixels (reference numeral PX of FIG. 5).

For example, each pixel PX may include a first sub-pixel PX1, a second sub-pixel PX2, and a third sub-pixel PX3. For example, a plurality of red light emitting device 150R may be disposed in the first sub-pixel PX1, a plurality of green light emitting devices 150G may be disposed in the second sub-pixel PX2, and a plurality of blue light emitting devices 150B may be disposed in the third sub-pixel PX3. The unit pixel PX may further include a fourth sub-pixel having no the light emitting device, but the embodiment is not limited thereto.

Figure 9:
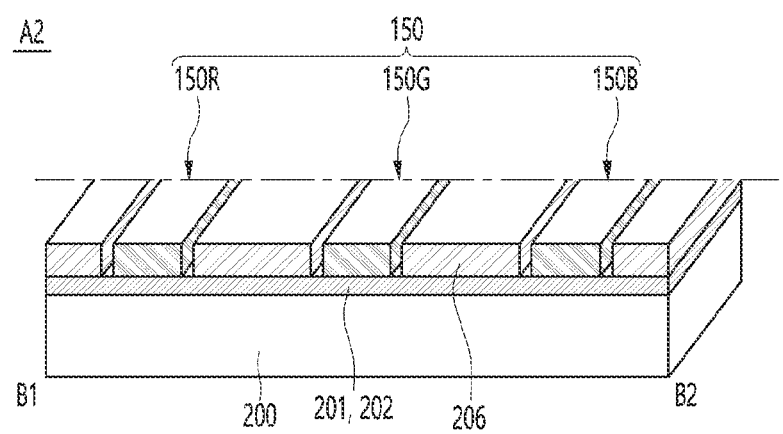
FIG. 9 is an enlarged view of region A2 of FIG. 8.

FIG. 9 is an enlarged view of region A2 of FIG. 8.

Referring to FIG. 9, according to the embodiment, the display device 100 may include a substrate 200, assembling wires 201 and 202, an insulating layer 206, and a plurality of light emitting devices 150. The display device 100 may further include a larger number of components.

The assembling wires may include a first assembling wire 201 and a second assembling wire 202 spaced apart from each other. The first assembling wire 201 and the second assembling wire 202 may be provided to generate the dielectrophoretic force for assembling the light emitting device 150. The light emitting device 150 may be one of a lateral-type light emitting device, a flipchip-type light emitting device, and a vertical-type light emitting device.

The light emitting device 150 includes a red light emitting device 150R, a green light emitting device 150G, and a blue light emitting device 150B, but the embodiment is not limited thereto. For example, the light emitting device 150 may include a red phosphor and a green phosphor to realize a red color and a green color, respectively.

The substrate 200 may include a rigid substrate or a flexible substrate. The substrate 200 may include glass or polyimide. Alternatively, the substrate 200 may include a flexible material, such as Polyethylene Naphthalate (PEN), or Polyethylene Terephthalate (PET). Alternatively, the substrate 200 may include a transparent material, but the embodiment is not limited thereto.

The insulating layer 206 may include a material, such as polyimide, PEN or PET, having an insulating property and a flexible property, and may be integrated with the substrate 200 to form one substrate.

The insulating layer 206 may be a conductive adhesive layer having an adhesive property and a conductive property. The conductive adhesive layer may have a flexible property such that the display device 100 has a flexible function. For example, the insulating layer 206 may be an anisotropy conductive film (ACF) or a conductive adhesive layer including an anisotropy conductive medium or conductive particles. The conductive adhesive layer may be a layer having electrical conductivity in a vertical direction with respect to the thickness thereof, but having an electrically insulating property in a horizontal direction with respect to the thickness thereof.

The insulating layer 206 may include an assembling hole 203 to insert the light emitting device 150. Accordingly, the light emitting device 150 may be easily inserted into the assembling hole 203 of the insulating layer 206, in self-assembling. The assembling hole 203 may be named as an insertion hole, a fixing hole, and an alignment hole.

Figure 10:
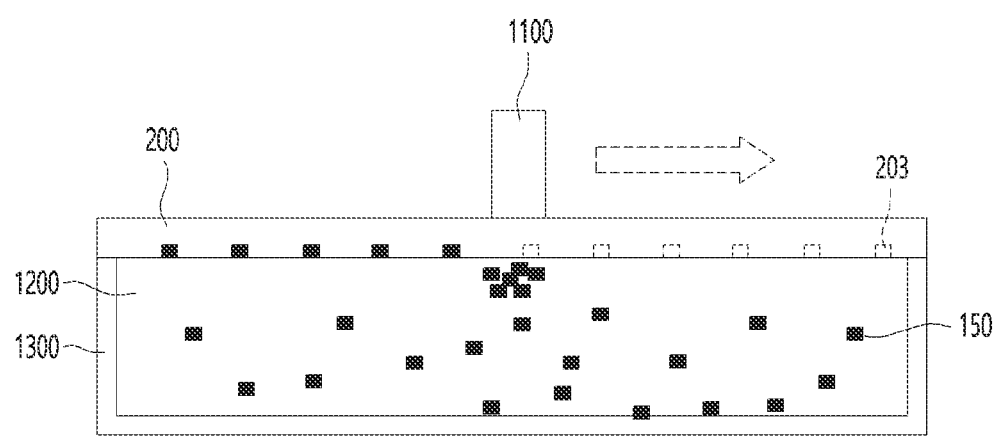
FIG. 10 is a view illustrating that a light emitting device is assembled with a substrate through a self-assembly method according to the embodiment.

FIG. 10 shows that a light emitting device is assembled with a substrate through a self-assembly method according to the embodiment.

The self-assembly method of the light emitting device will be described with reference to FIGS. 9 and 10.

The substrate 200 may be a panel substrate of the display device. Although the following description is described while focusing on the substrate 200 is the panel substrate, the embodiment is not limited thereto.

The substrate 200 may include glass or polyimide. In addition, the substrate 200 may include a material, such as PEN or PET, having flexibility. Alternatively, the substrate 200 may include a transparent material, but the embodiment is not limited thereto.

Referring to FIG. 10, the light emitting device 150 may be introduced into a chamber 1300 filled with a fluid 1200. The fluid 1200 may be de-ionized water, but the embodiment is not limited thereto. The chamber 1300 may be classified into a bath, a container, or a vessel.

Thereafter, the substrate 200 may be disposed on the chamber 1300. According to an embodiment, the substrate 200 may be introduced into the chamber 1300.

As illustrated in FIG. 9, a pair of assembling wires 201 and 202, which correspond to the light emitting device 150 to be assembled, may be disposed in the substrate 200

The assembling wires 201 and 202 may include a transparent electrode (ITO), or a metal material having excellent conductivity. For example, the assembling wires 201 and 202 may include at least one of titanium (Ti), chromium (Cr), nickel (Ni), aluminum (Al), platinum (Pt), gold (Au), tungsten (W), or molybdenum (Mo), or the alloy thereof.

The assembling wires 201 and 202 may form an electric field by the voltage supplied from the outside, and the dielectrophoretic force may be formed between the assembling wires 201 and 202 due to the electric field. The light emitting device 150 may be fixed into the assembling hole 203 on the substrate 200 by the dielectrophoretic force.

The interval between the assembling wires 201 and 202 is formed to be smaller than the width of the light emitting device 150 and the width of the assembling hole 203, such that the assembling position of the light emitting device 150 using the electric field may be more precisely fixed.

The insulating layer 206 may be formed on the assembling wires 201 and 202 to protect the assembling wires 201 and 202 from the fluid 1200, and to prevent a current, which flows through the assembling wires 201 and 202, from leaking. The insulating layer 206 may be formed in a single layer or a multi-layer including an inorganic insulator, such as silica or alumina, or an organic insulator.

The insulating layer 206 may include a material, such as polyimide, PEN or PET, having an insulating property and a flexible property, and may be integrated with the substrate 200 to form one substrate.

The insulating layer 206 may include an insulating layer having an adhesive property or a conductive insulating layer having conductivity. The insulating layer 206 may have a flexible property such that the display device 100 has a flexible function.

The insulating layer 206 may have a barrier, and the assembling hole 203 may be formed by the barrier. For example, when the substrate 200 is formed, a portion of the insulating layer 206 is removed, such that each light emitting device 150 is assembled with the assembling hole 203 of the insulating layer 206.

The substrate 200 may have assembling holes 203 coupled to light emitting devices 150, and the surface, which has the assembling hole 203, of the substrate 200 may make contact with the fluid 1200. The assembling hole 203 may guide the accurate assembling position of the light emitting device 150.

Meanwhile, the assembling hole 203 may have the shape and the size corresponding to the shape of the light emitting device 150 to be assembled at the corresponding position. Accordingly, another light emitting device or a plurality of light emitting devices may be prevented from being assembled into the assembling hole 203.

Referring back to FIG. 10, after the substrate 200 is disposed, an assembling device 1100 including a magnetic substance may move along the substrate 200. The magnetic substance may include a magnet or an electromagnet. The assembling device 1100 may move while making contact with the substrate 200, such that a region influenced by a magnetic field is present in the fluid 1200 as much as possible. According to an embodiment, the assembling device 1100 may include a plurality of magnetic substances or may include a magnetic substance corresponding to the substrate 200. In this case, the moving distance of the assembling device 1100 may be limited to be in a specific range.

The light emitting device 150 in the chamber 1300 may move toward the assembling device 1100 due to the magnetic field generated by the assembling device 1100.

The light emitting device 150 may be introduced into the assembling hole 203 to make contact with the substrate 200, while moving toward the assembling device 1100.

In this case, the electric field applied by the assembling wires 201 and 202 formed on the substrate 200 may prevent the light emitting device 150, which makes contact with the substrate 200, from being detached from the substrate 200 by the movement of the assembling device 1100.

In other words, the self-assembly method using an electromagnetic field may sharply reduce a time taken when each light emitting device 150 is assembled with the substrate 200. Accordingly, a large-area and high-pixel-density display may be more rapidly and economically realized.

A solder layer (not illustrated) may be additionally formed between the light emitting device 150, which is assembled with the assembling hole 203 in the substrate 200, and the substrate 200, such that the coupling force of the light emitting device 150 may be improved.

Thereafter, an electrode wire (not illustrated) is connected with the light emitting device 150 to apply power to the light emitting device 150.

Hereinafter, although not illustrated, at least one insulating layer may be formed through the following process. The at least one insulating layer may include a transparent resin or a resin including a reflective material or a scattering material.

Meanwhile, according to the embodiment, the display device may display an image using a light emitting device. According to the embodiment, the light emitting device, which is a self-emissive device to emit light for itself, may include a semiconductor light emitting device. According to the embodiment, since the light emitting device is an inorganic semiconductor material, the light emitting device is deteriorated less. In addition, since the light emitting device has a semi-permanent lifespan, the light emitting device provides stable light, thereby contributing to the display device realizing high quality and high image quality.

For example, the display device may use the light emitting device as a light source, and a color generator is provided on the light emitting device. Accordingly, the image may be displayed through the color generator (see FIG. 11).

Although not illustrated, the display device may display an image through a display panel in which a plurality of light emitting devices to generate mutually different color lights is disposed in a pixel.

Figure 11:
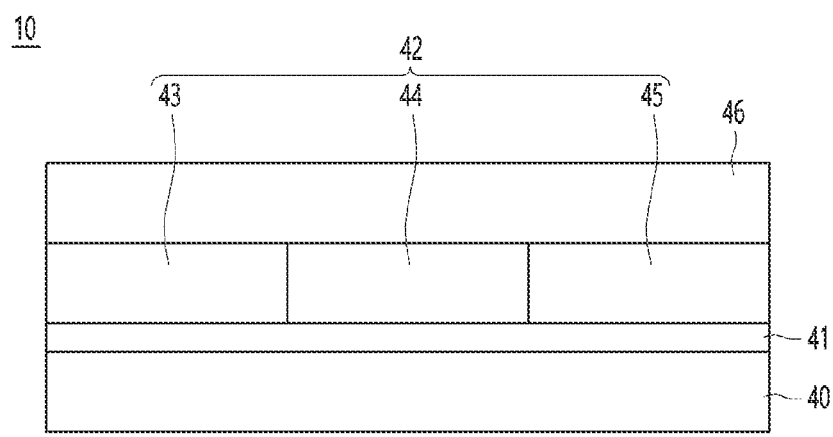
FIG. 11 is a cross-sectional view schematically illustrating a display panel of FIG. 5.

FIG. 11 is a cross-sectional view schematically illustrating a display panel of FIG. 5.

Referring to FIG. 11, according to the embodiment, the display panel 10 may include a first substrate 40, a light emitting part 41, a color generator 42, and a second substrate 46. According to an embodiment, the display panel 10 may include more components, but the embodiment is not limited thereto. The first substrate 40 may be the substrate 200 illustrated in FIG. 9.

Although not illustrated, at least one insulating layer may be disposed between the first substrate 40 and the light emitting part 41, between the light emitting part 41 and the color generator 42, and/or between the color generator 42 and the second substrate 46, but the embodiment is not limited thereto.

The first substrate 40 may support the light emitting part 41, the color generator 42, and the second substrate 46.

The first substrate 40 may include various components as described above. For example, the first substrate 40 may include data lines D1 to Dm (m is an integer value equal to or greater than 2), scan lines S1 to Sn, and a high-potential voltage line and a low-potential voltage line as illustrated in FIG. 5, a plurality of transistors ST and DT and at least one capacitor Cst as illustrated in FIG. 6, and a first pad electrode 210 and a second pad electrode 220 as illustrated in FIG. 7.

The first substrate 40 may include glass or a flexible material, but the embodiment is not limited thereto.

The light emitting part 41 may provide light to the color generator 42. The light emitting part 41 may include a plurality of light sources to self-emit light, as electricity is applied thereto. For example, the light source may include the light emitting device 150 (see FIG. 8).

For example, the plurality of light emitting devices 150 are divided and disposed depending on sub-pixels in the pixel. Accordingly, the plurality of light emitting devices 150 may autonomously emit light under the individual control of each sub-pixel.

For another example, the plurality of light emitting devices 150 are disposed regardless of pixels. Accordingly, the plurality of light emitting devices 150 may simultaneously emit light in all sub-pixels.

According to the embodiment, the light emitting device 150 may emit blue light, but the embodiment is not limited thereto. For example, according to the embodiment, the light emitting device 150 may emit white light or violet light.

Meanwhile, the light emitting device 150 may emit red light, green light, or blue light for each sub-pixel. To this end, for example, a red light emitting device to emit the red light is disposed in the first sub-pixel, that is, a red sub-pixel, a green light emitting device to emit the green light is disposed in the second sub-pixel, that is, a green sub-pixel, and a blue light emitting device to emit the blue light is disposed in the third sub-pixel, that is, a blue sub-pixel.

For example, the red light emitting device, the green light emitting device, and the blue light emitting device may include the group II-I compound or the group III-V compound, but the embodiment is not limited thereto. For example, the group III-V compound may be selected from the group consisting of: a binary compound selected from the group consisting of GaN, GaP, GaAs, GaSb, AlN, AlP, AlAs, AlSb, InN, InP, InAs, InSb, and the mixture thereof; a ternary compound selected from the group consisting of GaNP, GaNAs, GaNSb, GaPAs, GaPSb, AlInP, AlNP, AlNAs, AlNSb, AlPAs, AlPSb, InNP, InNAs, InNSb, InPAs, InPSb, GaAlNP, and mixtures thereof; and a quaternary compound selected from the group consisting of AlGaInP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and the mixture thereof.

The color generator 42 may generate color light different from light generated from the light emitting part 41.

For example, the color generator 42 may include a first color generator 43, a second color generator 44, and a third color generator 45. The first color generator 43 may correspond to the first sub-pixel PX1 of the pixel, the second color generator 44 may correspond to the second sub-pixel PX2 of the pixel, and the third color generator 45 may correspond to the third sub-pixel PX3 of the pixel.

The first color generator 43 may generate first color light based on the light provided by the light emitting part 41, the second color generator 44 may generate second color light based on the light provided by the light emitting part 41, and the third color generator 45 may generate third color light based on the light provided by the light emitting part 41. The first color generator 43 may output blue light from the light emitting part 41 to red light, the second color generator 44 may output the blue light from the light emitting part 41 to green light, and the third color generator 45 may output the blue light from the light emitting part 41 without change.

The first color generator 43 may include a first color filter, the second color generator 44 may include a second color filter, and the third color generator 45 may include a third color filter.

The first color filter, the second color filter, and the third color filter may include transparent materials to transmit light.

For example, at least one of first color filter, the second color filter, or the third color filter may include a quantum dot.

According to an embodiment, the quantum dot may include a material selected from the group II-IV compound, the group III-V compound, the group IV-VI compound, the group IV element, the group IV compound, and the combination thereof.

The group II-VI compound may be selected from the group consisting of a binary compound selected from the group consisting of CdSe, CdTe, ZnS, ZnSe, ZnTe, ZnO, HgS, HgSe, HgTe, MgSe, MgS, and the mixture thereof, a ternary compound selected from the group consisting of CdSeS, CdSeTe, CdSTe, ZnSeS, ZnSeTe, ZnSTe, HgSeS, HgSeTe, HgSTe, CdZnS, CdZnSe, CdZnSe, CdHgS, CdHgSe, CdHgSe, HgZnS, HgZnSe, HgZnSe, MgZnSe, MgZnS, and the mixture thereof, and a quaternary compound selected from the group consisting of HgZnTeS, CdZnSeS, CdZnSeTe, CdZnSTe, CdHgSeS, CdHgSeTe, CdHgSTe, HgZnSeS, HgZnSeTe, HgZnSTe, and the mixture thereof.

For example, the group III-V compound may be selected from the group consisting of: a binary compound selected from the group consisting of GaN, GaP, GaAs, GaSb, AlN, Alp, AlAs, AlSb, InN, InP, InAs, InSb, and the mixture thereof; a ternary compound selected from the group consisting of GaNP, GaNAs, GaNSb, GaPAs, GaPSb, AlInP, AlNP, AlNAs, AlNSb, AlPAs, AlPSb, InNP, InNAs, InNSb, InPAs, InPSb, GaAlNP, and the mixture thereof; and a quaternary compound selected from the group consisting of AlGaInP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and the mixture thereof.

The group IV-VI compound may be selected from the group consisting of: a binary compound selected from the group consisting of SnS, SnSe, SnTe, PbS, PbSe, PbTe, and the mixture thereof; a ternary compound selected from the group consisting of SnSeS, SnSeTe, SnSTe, PbSeS, PbSeTe, PbSTe, SnPbS, SnPbSe, SnPbTe, and the mixture thereof; and a quaternary compound selected from the group consisting of SnPbSSe, SnPbSeTe, SnPbSTe, and the mixture thereof.

The group IV element may be selected from the group consisting of Si, Ge, and the mixture thereof. The group IV compound may be a binary compound selected from the group consisting of SiC, SiGe, and the mixture thereof.

Such a quantum dot may have a full width of half maximum (FWHM) of the emission wavelength spectrum of about 45 nm or less, and the light emitted through the quantum dot may be emitted in all directions. Accordingly, a viewing angle of the light emitting device may be improved.

Meanwhile, the quantum dot may have a spherical form, a pyramidal shape, a multi-arm form, or a cubic nanoparticle, a nano-tube, a nano-wire, a nano-fiber, or a nano-plate particle, but the embodiment is not limited thereto.

For example, when the light emitting device 150 emits blue light, the first color filter may include a red quantum dot, and the second color filter may include a green quantum dot. The third color filter may not include a quantum dot, but the embodiment is not limited thereto. For example, the blue light of the light emitting device 150 may be absorbed by the first color filter, and the absorbed blue light is wavelength-shifted by the red quantum dot, such that the red light is output. For example, the blue light of the light emitting device 150 may be absorbed by the second color filter, and the absorbed blue light is wavelength-shifted by the green quantum dot, such that the green light is output. For example, the blue light of the light emitting device 150 may be absorbed by the third color filter, and the absorbed blue light may be output without change.

Meanwhile, when the light emitting device 150 emits white light), the third color filter may include a quantum dot, in addition to the first color filter and the second color filter. In other words, the white light of the light emitting device 150 may be wavelength-shifted to the blue light by the quantum dot included in the third color filter.

For example, at least one of the first color filter, the second color filter, or the third color filter may include a phosphor. For example, some of the first color filter, the second color filter, and the third color filter may include a quantum dot, and some of the first color filter, the second color filter, and the third color filter may include a phosphor. For example, each of the first color filter and the second color filter may include a phosphor and a quantum dot. For example, at least one of the first color filter, the second color filter, or the third color filter may include distracting particles. The blue light incident onto the first color filter, the second color filter, or the third color filter is distracted by the distracting particles, and the distracted blue light is color-shifted by the relevant quantum dot. Accordingly, the light output efficiency may be improved.

For example, the first color generator 43 may include a first color converting layer and a first color filter. For example, the second color generator 44 may include a second color converting layer and a second color filter. For example, the third color generator 45 may include a third color converting layer and a third color filter. The first color converting layer, the second color converting layer, and the third color converting layer may be disposed adjacent to the light emitting pat 41. The first color filter, the second color filter, and the third color filter may be disposed adjacent to the second substrate 46.

For example, the first color filter may be interposed between the first color converting layer and the second substrate 46. For example, the second color filter may be interposed between the second color converting layer and the second substrate 46. For example, the third color filter may be interposed between the third color converting layer and the second substrate 46.

For example, since the first color filter may make contact with the top surface of the first color converting layer, and may have the same size as that of the first color converting layer, but the embodiment is not limited thereto. For example, since the second color filter may make contact with the top surface of the second color converting layer, and may have the same size as that of the second color converting layer, but the embodiment is not limited thereto. For example, since the third color filter may make contact with the top surface of the third color converting layer, and may have the same size as that of the third color converting layer, but the embodiment is not limited thereto.

For example, the first color converting layer may include a red quantum dot, and the second color converting layer may include a green quantum dot. The third color converting layer may not include a quantum dot. For example, the first color filter may include a red-based material for selectively, transmitting red light converted in the first color converting layer, the second color filter may include a green-based material for selectively, transmitting green light converted in the second color converting layer, and the third color filter may include a blue-based material for selectively transmitting blue light transmitted from the third color converting layer without change.

Meanwhile, when the light emitting device 150 emits white light, the third color converting layer may include a quantum dot, in addition to the first color converting layer and the second color converting layer. In other words, the white light of the light emitting device 150 may be wavelength-shifted into the blue light by the quantum dot included in the third color filter.

Referring back to FIG. 11, the second substrate 46 may be disposed on the color generator 42 to protect the color generator 42. The second substrate 46 may include glass, but the embodiment is not limited thereto.

The second substrate 46 may be named as a cover window or a cover glass.

The second substrate 46 may include glass or a flexible material, but the embodiment is not limited thereto.

Meanwhile, according to the embodiment, first holes are formed in the first assembling wire and the second assembling wire having the second width smaller than the first width of the first assembling wire, such that an electric field is intensively distributed in the first holes in the self-assembling. Accordingly, the semiconductor light emitting device may be more easily, exactly, and rapidly assembled with the first hole by using stronger dielectrophoretic force formed in the first holes, such that the assembling efficiency may be improved.

In addition, according to the embodiment, the first holes are formed in the first assembling wire and the second assembling wire having the second width smaller than the first width of the first assembling wire, such that the dielectrophoretic force is weakened or any dielectrophoretic force is not generated on an upper portion of the first holes. Accordingly, another semiconductor light emitting device does not overlap with a semiconductor light emitting device assembled in the first hole, thereby preventing the assembling failure.

Hereinafter, a display device will be described according to various embodiments with reference to various drawings.

First Embodiment

Figure 12:
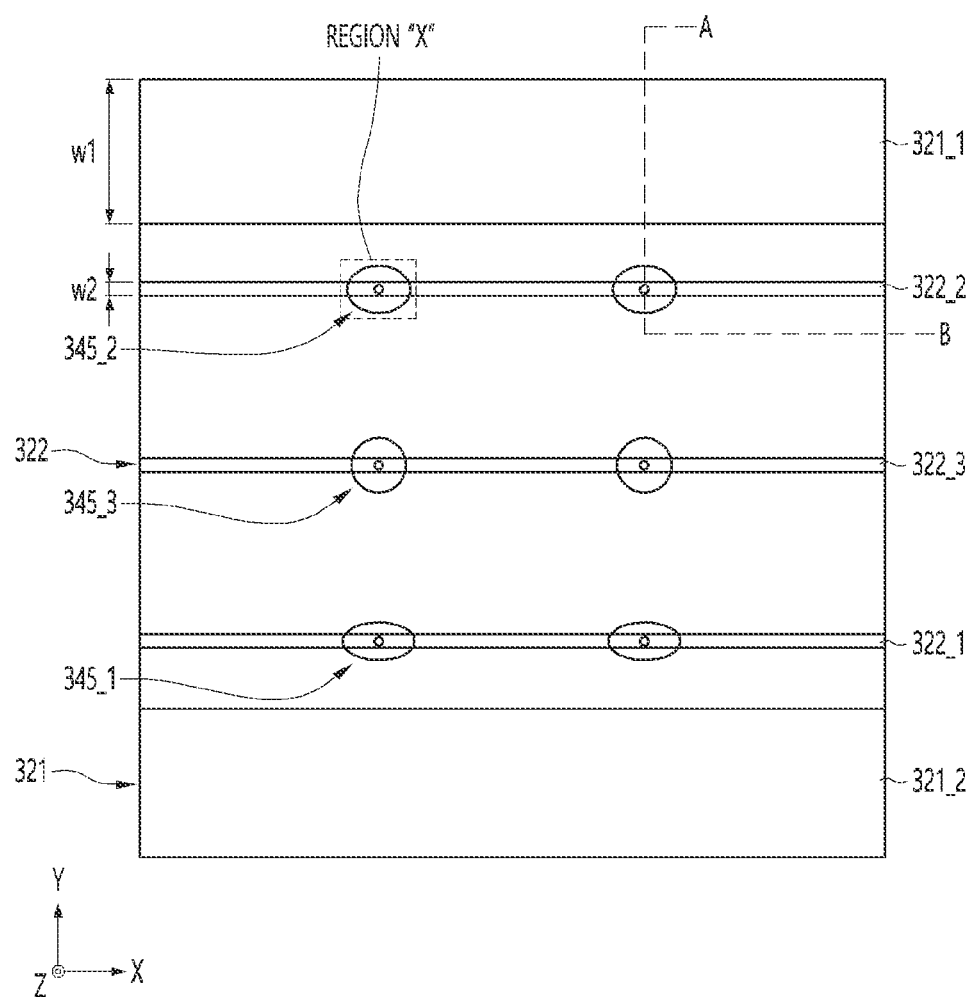
FIG. 12 is a plan view illustrating a display device according to a first embodiment.
Figure 13:
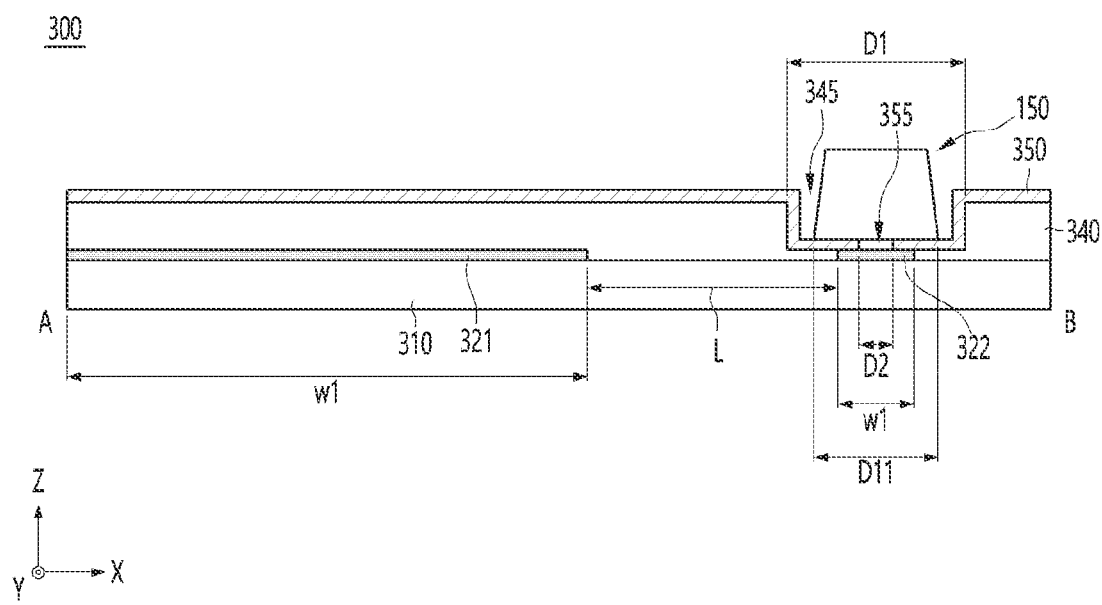
FIG. 13 is a cross-sectional view taken along line D-E of FIG. 12.

FIG. 12 is a plan view illustrating a display device according to a first embodiment. FIG. 13 is a cross-sectional view taken along line A-B of FIG. 12.

Referring to FIGS. 12 and 13, according to a first embodiment, a display device 300 may include a substrate 310, a plurality of first assembling wires 321, a plurality of second assembling wires 322, a first insulating layer 340, and a semiconductor light emitting device 150.

Figure 17:
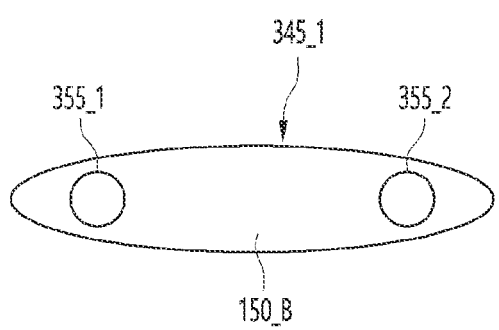
FIG. 17 shows a blue semiconductor light emitting device correctly assembled to a first assembling hole.
Figure 19:
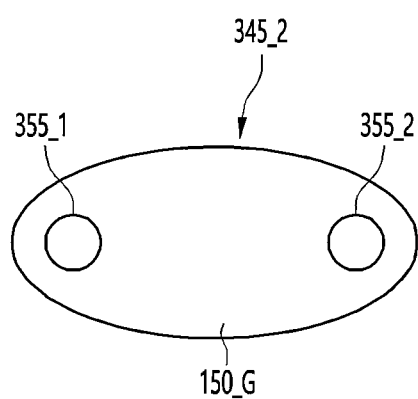
FIG. 19 shows a green semiconductor light emitting device correctly assembled to a second assembling hole.
Figure 21:
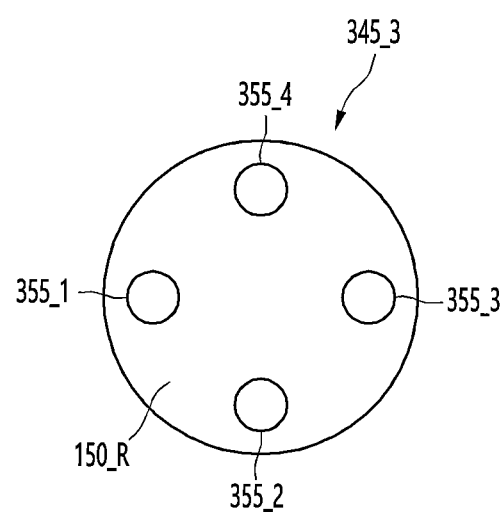
FIG. 21 shows a red semiconductor light emitting device correctly assembled to a third assembling hole.
Figure 22A:
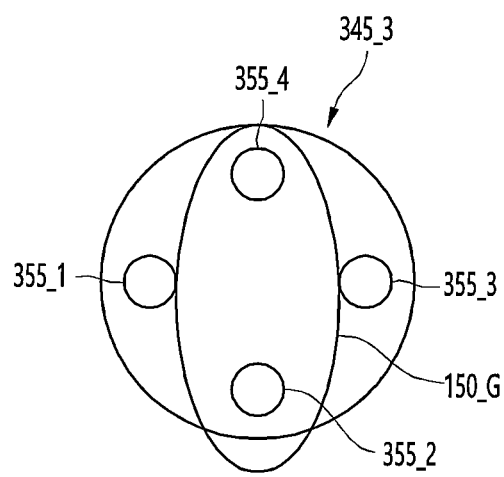
FIGS. 22A and 22B show different semiconductor light emitting devices erroneously assembled to a third assembling hole, instead of a red semiconductor light emitting device.
Figure 22B:
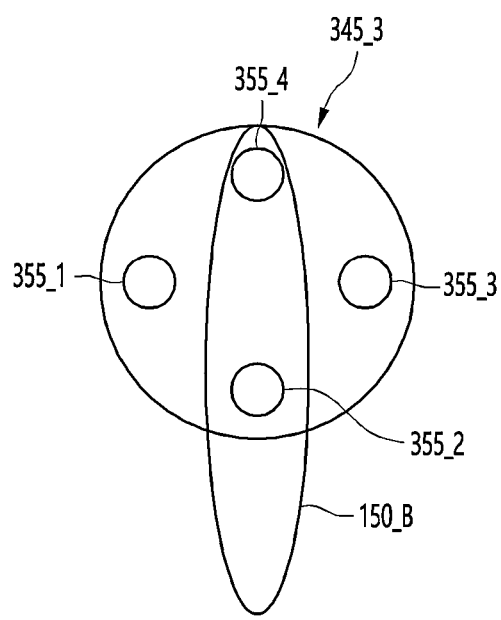

According to the embodiment, the semiconductor light emitting device 150 may include a blue semiconductor light emitting device 150_B, a green semiconductor light emitting device 150_G, and a red semiconductor light emitting device 150_R, as illustrated in FIGS. 17, 19, and 21. A color image may be realized by blue light generated from the blue semiconductor light emitting device 150_B, green light generated from the green semiconductor light emitting device 150_G, and red light generated from the red semiconductor light emitting device 150_R. For example, the blue semiconductor light emitting device 150_B may be named as the first semiconductor light emitting device, the green semiconductor light emitting device 150_G may be named as the second semiconductor light emitting device, and the red semiconductor light emitting device 150_R may be named as the third semiconductor light emitting device.

The substrate 310 may include a rigid substrate or a flexible substrate. The substrate 310 may include a transparent material.

The first assembling wire 321 and the second assembling wire 322 may be longitudinally disposed in the X-axis direction. The first assembling wire 321 and the second assembling wire 322 may be disposed in parallel to each other. The first assembling wires 321 and the second assembling wires 322 may have the same interval therebetween in the Y-axis direction.

The first assembling wire 321 may have a first width w1 in the Y-axis direction, and the second assembling wire 322 may have a second width w2 in the Y-axis direction. The second width w2 may be less than or equal to 1/10 of the first width w1, but the embodiment is not limited thereto. As described above, the second width w2 of the second assembling wire 322 is narrower than the first width w1 of the first assembling wire 321. Accordingly, when the electric field is generated by the voltage applied to the first assembling wire 321 and the second assembling wire 322 in the self-assembly, the electric field may be intensively generated from the second assembling wire 322 instead of the first assembling wire 321. In general, the electric field is more distributed in the vertical direction, as the first assembly wire 321 approaches the second assembly wire 322, and is distributed in the horizontal direction between the first assembly wire 321 and the second assembly wire 322. Accordingly, the electric field may be intensively distributed in the vertical direction on the second assembling wire 322. In particular, since the second width w2 of the second assembling wire 322 is significantly narrower than the first width w1 of the first assembling wire 321, an electric field may be more densely distributed on the second assembling wire 322.

The first assembling wire 321 and the second assembling wire 322 may be members to assemble the semiconductor light emitting device 150 onto the substrate 310 in self-assembling. In other words, the electric field is generated by the voltage applied to the first assembling wire 321 and the second assembling wire 322, and dielectrophoretic force may be formed by the electric field. The plurality of semiconductor light emitting devices 150 may move by the magnetic substance in the fluid when performing the self-assembling. As described above, the semiconductor light emitting device 150, which is moving, may be influenced by the dielectrophoretic force and assembled on the substrate 310. That the semiconductor light emitting device 150 is assembled on the substrate 310 may refer to that the semiconductor light emitting device 150 is fixed onto the substrate 310 by the dielectrophoretic force, or refer to that the semiconductor light emitting device 150 is maintained fixed onto the substrate 310.

The first assembling wire 321 and the second assembling wire 322 may include metal having excellent electric conductivity. For example, the first assembling wire 321 and the second assembling wire 322 may include aluminum (Al) or copper (Cu), or may be provided in a multi-structure. The multi-structure may be, for example, Mo/Al/Mo, Ti/Al/Ti, and Ti/Cu/Ti, but the embodiment is not limited thereto.

For example, the interval L between the first assembling wire 321 and the second assembling wire 322 may be greater than the diameter D1 of the semiconductor light emitting device 150. In this case, the diameter D1 of the semiconductor light emitting device 150 may be a diameter of a minor axis, when the semiconductor light emitting device 150 has a major axis and a minor axis which are different from each other.

Accordingly, the interval L between the first assembling wire 321 and the second assembling wire 322 is wider, and the first insulating layer 340 has a lower capacitance. Therefore, when the semiconductor light emitting device 150 is driven, and when a signal is applied to the semiconductor light emitting device 150, the signal distortion may be minimized.

In addition, since the interval L between the first assembling wire 321 and the second assembling wire 322 is wider, even if a greater voltage is applied to the space between the first assembling wire 321 and the second assembling wire 322, the electrical short failure may not be caused between the first assembling wire 321 and the second assembling wire 322. In addition, the semiconductor light emitting device may be more rapidly assembled by using greater dielectrophoretic force formed by greater voltage, and the assembled semiconductor light emitting device is more firmly fixed, thereby preventing the assembling failure.

According to an embodiment, the semiconductor light emitting device 150 may be assembled on the second assembling wire 322, but the embodiment is not limited thereto. To this end, the first hole 345 is formed on the second assembling wire 322, and the semiconductor light emitting device 150 may be assembled with the first hole 345.

In particular, according to an embodiment, the first hole 345 may be provided on an assembling wire having a narrower width of the widths w1 and w2 of the first assembling wire 321 and the second assembling wire 322. For example, when the second width w2 of the second assembling wire 322 is less than the first width w1 of the first assembling wire 321, the first hole 345 may be provided on the second assembling wire 322. For example, when the first width w1 of the first assembling wire 321 is less than the second width w2 of the second assembling wire 322, the first hole 345 may be provided on the first assembling wire 321.

Accordingly, only the semiconductor light emitting device 150 matched with the first hole 345 may be assembled to the first hole 345 by using a characteristic in that the first hole 345 is formed on the second assembling wire 322 having a narrower width w2, an electric filed is more densely distributed in the second assembling wire 322 having the narrower width w2 in the self-assembling, and the strength of the electric field is rapidly reduced in the Z-axis direction on the second assembling wire 322 having the narrower width w2. Accordingly, the assembling failure may be prevented and the assembling efficiency may be improved.

As described above, the electric field may be intensively distributed on the second assembling wire 322 in the Z-axis direction (or the upper direction or the vertical direction). In particular, the concentration of the electric field, that is, the strongest electric field strength may be formed on the top surface of the second assembling wire 322, and the electric field may be rapidly reduced in the direction of being away from the second assembling wire 322, that is, in the upper direction (Z-axis direction).

The first hole 345 is provided on the second assembling wire 322, and the same electric field strength may be distributed even in the first hole 345. In other words, the strongest electric field strength may be formed on the bottom part of the first hole 345, that is, the top surface of the second wiring electrode, or near the top surface of the second wiring electrode. In addition, the strength of the electric field may be rapidly reduced in the Z-axis direction of being away from the bottom part of the first hole 345.

Figure 15:
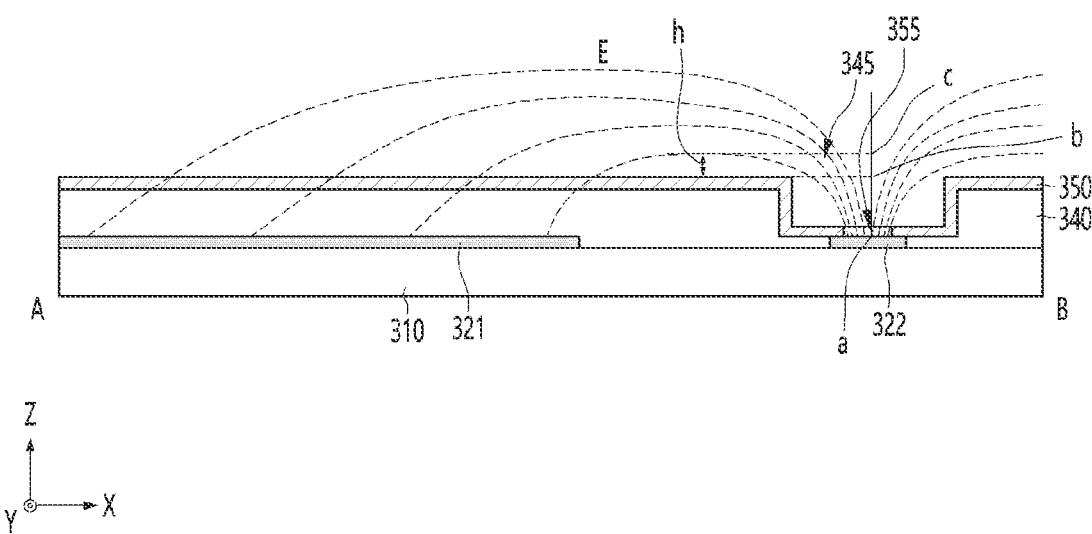
FIG. 15 shows the distribution of an electric field in self-assembling in a display panel, according to first embodiment.
Figure 16:
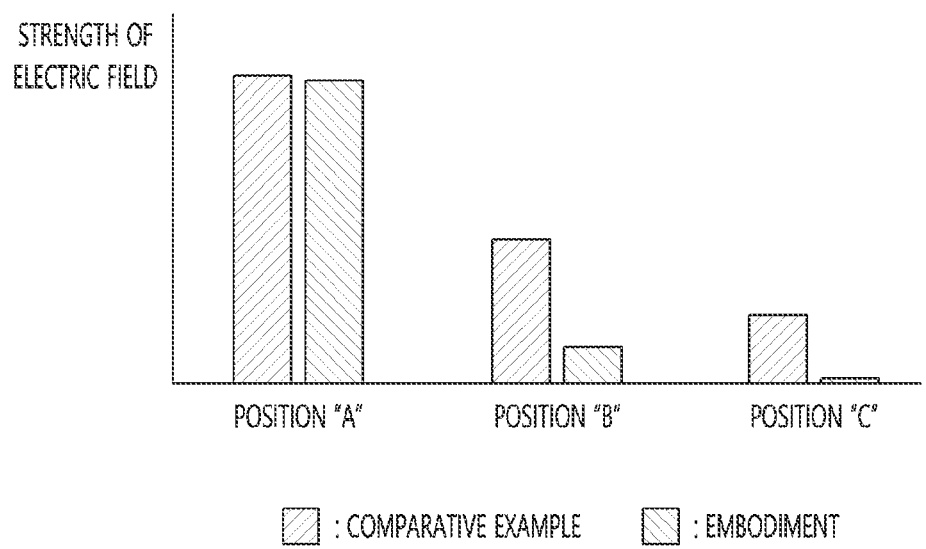
FIG. 16 shows the strength of an electric field in a vertical direction in an assembling hole in a comparative example, and the embodiment.

In FIG. 16, a comparative example illustrates the strength of an electric field in the Z-axis direction in the assembling hole 6 provided on the first assembling wire 2 and the second assembling wire 3, and the embodiment illustrates the strength of the electric field in the Z-axis direction in the assembling hole provided on the second assembling wire 322 illustrated in FIG. 15.

It should be understood that the strength of the electric field according to position "a", position "b", and position "c" is rapidly reduced in the embodiment rather than the comparative example. In particular, according to the embodiment, the electric field is hardly formed in position "c". Accordingly, in the embodiment rather than the comparative example, since the strength of the electric field is weakened or the electric field is not formed at an upper portion of the first hole 345 or above the upper portion of the first hole 345. Accordingly, only the semiconductor light emitting device 150 having the shape corresponding to the shape of the first hole 345 may be rapidly assembled to the first hole 345 by the strong dielectrophoretic force at a bottom part of the first hole 345. Therefore, the assembling efficiency may be remarkably improved, and the assembling failure may be prevented. The position "a" may be a bottom part of the first hole 345, position "b" may be a position corresponding to the top surface of the first insulating layer 340 in the first hole 345, and position "c" may be a position corresponding to the height "h" from the top surface of the first insulating layer 340 in the first hole 345.

Meanwhile, although FIG. 12 illustrates that three second assembling wires 322 are disposed between two first assembling wires 321, one, two, or four or more assembling wires may be disposed. Alternatively, the plurality of first assembling wires 321 may be alternately disposed, and the plurality of second assembling wires 322 may be alternately disposed. The first widths w1 of the first assembling wires 321 alternately disposed may differ from each other, but the embodiment is not limited thereto.

As illustrated in FIG. 12, when three second assembling wires 322_1, 322_2, and 322_3 are disposed between two first assembling wires 321_1 and 321_2, electric fields may be generated between the two first assembling wires 321_1 and 321_2 and among three second assembling wires 322_1, 322_2, and 322_3. For example, the (2-1)-th assembling wire 322_1 may generate an electric field together with the (1-1)-th assembling wire 321-1, and may generate an electric field together with the (1-2)-th assembling wire 321-2. For example, the (2-2)-th assembling wire 322_2 may generate an electric field together with the (1-1)-th assembling wire 321-1, and may generate an electric field together with the (1-2)-th assembling wire 321-2. For example, the (2-3)-th assembling wire 322_3 may generate an electric field together with the (1-1)-th assembling wire 321-1, and may generate an electric field together with the (1-2)-th assembling wire 321-2.

Meanwhile, the first insulating layer 340 may be disposed on the substrate 310 to provide the assembly hole 345. Hereinafter, the assembly hole 345 is referred to as a first hole 345 to distinguish the assembly hole 345 from the second hole 355.

The first hole 345 may be disposed on the second assembling wire 322. A plurality of first holes 345 may be provided to be spaced from each other on the second assembling wire 322 longitudinally extending in the X-axis direction. The first holes 345 provided on the second assembling wire 322 longitudinally extending in the X-axis direction may be individually formed in a specific sub-pixel of the pixel, but the embodiment is not limited thereto.

The first hole 345 may include a (1-1)-th hole 345_1, a (1-2)-th hole 345_2, and a (1-3)-th hole 345_3. For example, the blue semiconductor light emitting device 150_B is disposed in the (1-1)-th hole 345_1, the green semiconductor light emitting device 150_G is disposed in the (1-2)-th hole 345_2, and the red semiconductor light emitting device 150_R may be disposed in the (1-3)-th hole 345_3. Since the (1-1)-th hole 345_1, the (1-2)-th hole 345_2, and the (1-3)-th hole 345_3 are aligned in line in the Y-axis direction, the blue semiconductor light emitting device 150_B, the green semiconductor light emitting device 150_G, and the red semiconductor light emitting device 150_R may be aligned in line in the Y-axis direction, but the embodiment is not limited thereto. One unit pixel may be defined by the blue semiconductor light emitting device 150_B, the green semiconductor light emitting device 150_G, and the red semiconductor light emitting device 150_R.

Accordingly, the shape of each of the (1-1)-th hole 345_1, the (1-2)-th hole 345_2, and the (1-3)-th hole 345_3 may correspond to the shape of each of the blue semiconductor light emitting device 150_B, the green semiconductor light emitting device 150_G, and the blue semiconductor light emitting device 150_R, respectively.

For example, the blue semiconductor light emitting device 150_B may have an elongated oval shape, the green semiconductor light emitting device 150_G may have a less elongated oval shape, and the red semiconductor light emitting device 150_R may have a circular shape, but embodiment is not limited thereto. For example, the blue semiconductor light emitting device 150_B, the green semiconductor light emitting device 150_G, and the red semiconductor light emitting device 150_R may be changed to have different shapes. Accordingly, the (1-1)-th hole 345_1 may have the elongated oval shape to correspond to the shape of the blue semiconductor light emitting device 150_B. The (1-2)-th hole 345_2 may have a less elongated oval shape to correspond to the shape of the green semiconductor light emitting device 150_G. The (1-3)-th hole 345_2 may have a circular shape to correspond to the shape of the red semiconductor light emitting device 150_R. The diameter of each of the (1-1)-th hole 345_1, the (1-2)-th hole 345_2, and the (1-3)-th hole 345_3 may be greater than the diameter of each of the blue semiconductor light emitting device 150_B, the green semiconductor light emitting device 150_G, and the blue semiconductor light emitting device 150_R, respectively, such that each of the blue semiconductor light emitting device 150_B, the green semiconductor light emitting device 150_G, and the blue semiconductor light emitting device 150_R is easily assembled.

The blue semiconductor light emitting device 150_B having the elongated oval shape corresponding to the shape of the (1-1)-th hole 345_1 may be disposed in the (1-1)-th hole 345_1. The green semiconductor light emitting device 150_G having the less elongated oval shape corresponding to the shape of the (1-2)-th hole 345_2 may be disposed in the (1-2)-th hole 345_2. The red semiconductor light emitting device 150_R having the circular shape corresponding to the shape of the (1-3)-th hole 345_3 may be disposed in the (1-3)-th hole 345_3.

As illustrated in FIGS. 18A to 18C, FIGS. 20A to 20C, and FIGS. 22A and 22B, some of different semiconductor light emitting devices, which do not correspond to the (1-1)-th hole 345_1, the (1-2)-th hole 345_2, and the (1-3)-th hole 345_3, may be positioned in the (1-1)-th hole 345_1, the (1-2)-th hole 345_2, and the (1-3)-th hole 345_3, respectively.

In this case, according to the related art, different semiconductor light emitting devices may be assembled to the (1-1)-th hole 345_1, the (1-2)-th hole 345_2, and the (1-3)-th hole 345_3, respectively, by stronger dielectrophoretic force above the (1-1)-th hole 345_1, the (1-2)-th hole 345_2, and the (1-3)-th hole 345_3, respectively. Accordingly, the assembling failure may be caused.

However, according to the embodiment, even if some of different semiconductor light emitting devices, which do correspond to the (1-1)-th hole 345_1, the (1-2)-th hole 345_2, and the (1-3)-th hole 345_3, are positioned in the (1-1)-th hole 345_1, the (1-2)-th hole 345_2, and the (1-3)-th hole 345_3, respectively, dielectrophoretic force is weaker or absent on an upper portion of the (1-1)-th hole 345_1, the (1-2)-th hole 345_2, and the (1-3)-th hole 345_3. Accordingly, the different semiconductor light emitting devices are not assembled to the (1-1)-th hole 345_1, the (1-2)-th hole 345_2, and the (1-3)-th hole 345_3, respectively, thereby improving the assembling efficiency and preventing the assembling failure. The details thereof will be described later.

Referring back to FIG. 13, the first insulating 340 may be formed of an organic material, but the embodiment is not limited thereto. The first insulating layer 340 may be named as a barrier, but the embodiment is not limited thereto.

The first insulating layer 340 may be formed of an inorganic material or an organic material representing an excellent breakdown voltage characteristic. The inorganic material may include $SiO_2$ or $SiN_x$, but the embodiment is not limited thereto.

For example, the thickness of the first insulating layer 340 may be less than the thickness of the semiconductor light emitting device 150, but the embodiment is not limited thereto. Accordingly, when the semiconductor light emitting device 150 is disposed in the first hole 345, the upper portion of the semiconductor light emitting device 150 may protrude upward beyond the top surface of the first insulating layer 340.

For example, the first insulating layer 340 may be provided to form the first hole 345. First, after forming the first insulating layer 340 on the substrate 310, the first hole 345 may be formed by removing the first insulating layer 340 from the upper portion of the second assembling wire 322 through an etching process. For example, the etching process may be performed until the top surface of the second assembling wire 322 is exposed, but the embodiment is not limited thereto.

According to the embodiment, when a specific voltage is applied to the first assembling wire 321 and the second assembling wire 322 for the self-assembling, the electric field may be formed between the first assembling wire 321 and the second assembling wire 322. In particular, since the second width w2 of the second assembling wire 322 is significantly less than the first width w1 of the first assembling wire 321, an electric field is more intensively distributed in the first hole 345 provided on the second assembling wire 322.

In this case, the electric field in the first hole 345 may be distributed in the vertical direction, and the strength of the electric field may be sharply reduced in the direction, that is, the Z-axis direction of being away from the bottom part of the first hole 345. In other words, as illustrated in FIG. 16, the strength of the electric field may be sharply reduced in the Z-axis direction in the first hole 345. In other words, the strength of the electric field is strongest in the bottom part (position "a") of the first hole 345, but is weak or absent at the upper portion (position "b") of the first hole 345 or above (position "c") the upper portion of the first hole 345. When compared to the comparative example, the strength of the electric field may be remarkably reduced at position "b" and position "c" according to the embodiment. In particular, according to the embodiment, the strength of the electric field approaches zero at position "c".

Therefore, according to the embodiment, since the electric field is intensively distributed in the first hole 345, especially, at the bottom part of the first hole 345 provided on the second assembling wire 322, even the dielectrophoretic force resulting from the intensively distributed electric field has the great value at the bottom part of the first hole 345 or near the bottom part of the first hole 345. Accordingly, only the semiconductor light emitting device 150 corresponding to the shape of the first hole 345 may be assembled to the first hole 345, and the semiconductor light emitting device 150 may be firmly assembled to the first hole 345 by the dielectrophoretic force having the greatest value at the bottom part of the first hole 345, thereby improving the assembling efficiency.

To the contrary, the semiconductor light emitting device 150, which does not correspond to the shape of the first hole 345, may not be assembled to the first hole 345. Even if the semiconductor light emitting device 150, which does not correspond to the shape of the first hole 345, is assembled to the first hole 345, since the dielectrophoretic force is weak or absent at the upper portion of the first hole 345, the semiconductor light emitting device 150 may be easily detached from the first hole 345.

In addition, even if the tolerance is formed between the semiconductor light emitting device 150 assembled to the first hole 345 and an inner part of the first hole 345, since the dielectrophoretic force is weak or absent at the upper portion of the first hole 345, a different semiconductor light emitting device 150 may not be fixed onto the semiconductor light emitting device 150 assembled to the first hole 345. Accordingly, the assembling failure caused by the repeated assembling may be prevented.

Meanwhile, the display device 300 according to the first embodiment may include the second insulating layer 350.

The second insulating layer 350 may be disposed on the first insulating layer 340 and the second assembling wire 322. The second insulating layer 350 may be disposed in the first hole 345. For example, the second insulating layer 350 may be disposed at the bottom part of the first hole 345 or an inner part of the first hole 345.

The second insulating layer 350 may include a material having a dielectric constant related to dielectrophoretic force. For example, the second insulating layer 350 may include an inorganic material or an organic material. The inorganic material may include $SiO_2$ or $SiN_x$, but the embodiment is not limited thereto.

The thickness of the second insulating layer 350 may be less than the thickness of the first insulating layer 340. For example, the thickness of the second insulating layer 350 may be in the range of 50 nm to 1 µm, but the embodiment is not limited thereto. When the thickness of the second insulating layer 350 is less than 50 nm, the dielectric constant exerting an influence on the dielectrophoretic force is small. When the thickness of the second insulating layer 350 exceeds 1 µm, the thickness of the display device 300 is increased, but the strength of the electric field may be reduced.

The second hole 355 may be formed in the second insulating layer 350. The second hole 355 may be positioned in the first hole 345. The diameter D2 of the second hole 355 may be significantly less than the diameter D1 of the first hole 345. The second hole 355 may be formed to expose a partial region of the second assembling wire 322 to the outside.

Accordingly, the second insulating layer 350 may be disposed in the entire portion of the substrate 310 except for the second hole 355. In other words, the second insulating layer 350, which is positioned in the first hole 345, of the second insulating layer 350 disposed in the entire portion of the substrate 310 is removed to expose the top surface of the second assembling wire 322, thereby forming the second hole 355 having the significantly less diameter.

Figure 14:
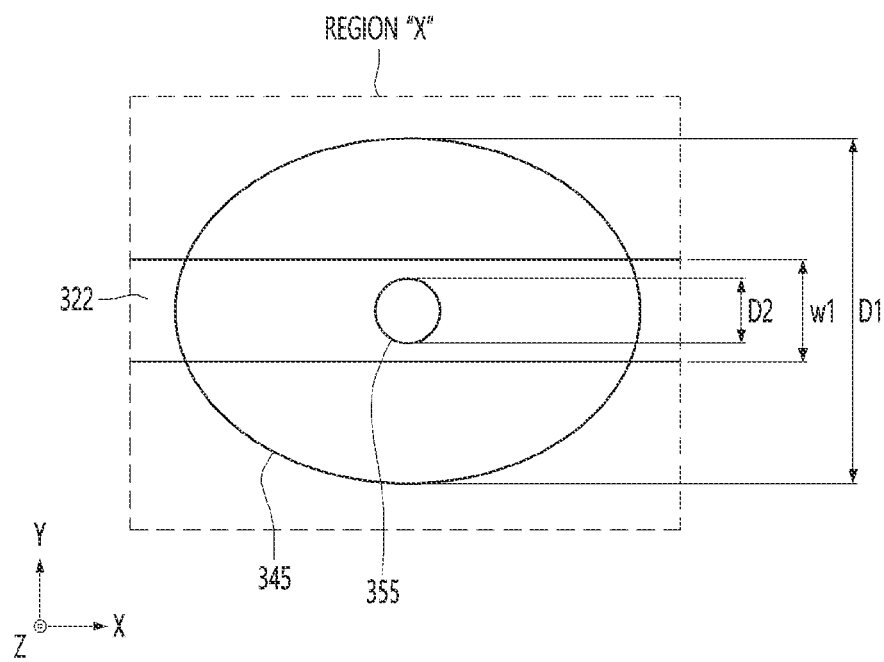
FIG. 14 is an enlarged view illustrating region X of FIG. 12.

As illustrated in FIG. 14, although the second hole 355 may have circular shape, the second hole 355 may have various shapes.

Meanwhile, the second width w2 of the second assembling wire 322 may be less than the diameter D1 of the first hole 345. The second width w2 of the second assembling wire 322 may be less than the diameter D11 of the semiconductor light emitting device 150.

Accordingly, when the electric field is generated between the first assembling wire 321 and the second assembling wire 322, the electric field is more intensively distributed in the first hole 345. In the self-assembling, the semiconductor light emitting device 150 may be more easily assembled in the first hole 345 by the dielectrophoretic force formed by the electric field more intensively distributed. In other words, the semiconductor light emitting device 150 corresponding to the shape of the first hole 345 may be easily inserted into the first hole 345 by the more increased dielectrophoretic force.

Meanwhile, the diameter D2 of the second hole 355 may be less than the second width w2 of the second assembling wire 322. For example, the diameter D2 of the second hole 355 may be less than the diameter D11 of the semiconductor light emitting device 150.

Accordingly, since the second hole 355 is provided to expose the partial region of the second assembling wire 322, when the electric field is generated between the first assembling wire 321 and the second assembling wire 322, the electric field is more intensively distributed in the second hole 355. In the self-assembling, when the semiconductor light emitting device 150 is assembled to the first hole 345, the second hole 355 may make contact with the bottom surface of the semiconductor light emitting device 150. In this case, the semiconductor light emitting device 150 assembled to the first hole 345 may be more firmly fixed to the first hole 345 due to the dielectrophoretic force formed by the electric field more intensively distributed in the first hole 345.

Meanwhile, at least two second holes 355 may be provided. Accordingly, the at least two second holes 355 may be positioned inside the first hole 345. For example, the at least two second holes 355 may be formed in the second insulating layer 350 inside the first hole 345.

The at least two second holes 355 may be formed adjacent to each other inside the first hole 345.

For example, as illustrated in FIGS. 17 and 19, when each of the (1-1)-th hole 345_1 and the (1-2)-th hole 345_2 has an oval shape having a major axis and a minor axis, the at least two second holes 355 may be positioned adjacent to each other inside each of the (1-1)-th hole 345_1 and the (1-2)-th hole 345_2, respectively, to face each other when viewed in the direction of the major axis. For example, a (2-1)-th hole 355_1 may be positioned at one side of the major axis in each of the (1-1)-th hole 345_1 and the (1-2)-th hole 345_2, and a (2-2)-th hole 355_2 may be positioned at an opposite side of the major axis in each of the (1-1)-th hole 345_1 and the (1-2)-th hole 345_2. In this case, the one side and the opposite side may be opposite ends of the major axis in the (1-1)-th hole 345_1 and the (1-2)-th hole 345_2, but the embodiment is not limited thereto.

For example, as illustrated in FIG. 21, when the (1-3)-th hole 345_3 has a circular shape, a plurality of holes 355_1 to 355_4 may be positioned adjacent to each other along the circumference of the edge of the (1-3)-th hole 345_3 inside the (1-3)-th hole 345_3. For example, the (2-1)-th hole 355_1 may be positioned at a first side of the (1-3)-th hole 345_3, the (2-2)-th hole 355_2 may be positioned at a second side of the (1-3)-th hole 345_3, the (2-3)-th hole 355-3 may be positioned at a third side of the (1-3)-th hole 345_3, and the (2-4)-th hole 355-4 may be positioned at a fourth side of the (1-3)-th hole 345_3. For example, the first side and the third side may be positioned on a horizontal line, and the second axis and the fourth axis may be positioned on a vertical line, but the embodiment is not limited thereto.

Although FIG. 21 illustrates the (2-1)-th hole 355_1, the (2-2)-th hole 355_2, the (2-3)-th hole 355-3, and the (2-4)-th hole 355-4 have equal distances therebetween, the (2-1)-th hole 355_1, the (2-2)-th hole 355_2, the (2-3)-th hole 355-3, and the (2-4)-th hole 355-4 may be randomly positioned in the (1-3)-th hole 345_3.

As described above, the blue semiconductor light emitting device 150_B having the elongated oval shape in the self-assembling may be assembled to the (1-1)-th hole 345-1 having the shape corresponding to the shape of the blue semiconductor light emitting device 150_B (see FIG. 17).

In this case, as the electric field is intensively distributed in the (2-1)-th hole 355_1 and the (2-2)-th hole 355_2 inside the (1-1)-th hole 345-1 in self-assembling, great dielectrophoretic force is formed in the (2-1)-th hole 355_1 and the (2-2)-th hole 355_2. Accordingly, the blue semiconductor light emitting device 150_B assembled to the (1-1)-th hole 345-1 may be firmly fixed to the second insulating layer 350 inside the (1-1)-th hole 345-1 due to the greater dielectrophoretic force formed in the (2-1)-th hole 355_1 and the (2-2)-th hole 355_2. In addition, the (2-1)-th hole 355_1 and the (2-2)-th hole 355_2 are positioned at opposite ends of the major axis inside the (1-1)-th hole 345-1. Accordingly, the blue semiconductor light emitting device 150_B is not eccentrically provided, but correctly positioned in the (1-1)-th hole 345-1.

The green semiconductor light emitting device 150_G having the less elongated oval shape in the self-assembling may be assembled to the (1-2)-th hole 345-2 having the shape corresponding to the shape of the green semiconductor light emitting device 150_G (see FIG. 19).

In this case, as the electric field is intensively distributed in the (2-1)-th hole 355_1 and the (2-2)-th hole 355_2 inside the (1-2)-th hole 345-2 in self-assembling, great dielectrophoretic force is formed in the (2-1)-th hole 355_1 and the (2-2)-th hole 355_2. Accordingly, the green semiconductor light emitting device 150_G assembled to the (1-2)-th hole 345-2 may be firmly fixed to the second insulating layer 350 inside the (1-2)-th hole 345-2 due to the greater dielectrophoretic force formed in the (2-1)-th hole 355_1 and the (2-2)-th hole 355_2. In addition, the (2-1)-th hole 355_1 and the (2-2)-th hole 355_2 are positioned at opposite ends of the major axis inside the (1-2)-th hole 345-2. Accordingly, the green semiconductor light emitting device 150_G is not eccentrically provided, but correctly positioned in the (1-2)-th hole 345-2.

The red semiconductor light emitting device 150_R having the circular shape in the self-assembling may be assembled to the (1-3)-th hole 345-3 having the shape corresponding to the shape of the red semiconductor light emitting device 150_R (see FIG. 21).

In this case, as the electric field is intensively distributed in the (2-1)-th hole 355_1 and the (2-4)-th hole 355_4 inside the (1-3)-th hole 345-3 in self-assembling, great dielectrophoretic force is formed in the (2-1)-th hole 355_1 and the (2-4)-th hole 355_4. Accordingly, the red semiconductor light emitting device 150_R assembled to the (1-3)-th hole 345-3 may be firmly fixed to the second insulating layer 350 inside the (1-3)-th hole 345-3 due to the great dielectrophoretic force formed in the (2-1)-th hole 355_1 and the (2-4)-th hole 355_4. In addition, the (2-1)-th hole 355_1 and the (2-4)-th hole 355_4 are positioned along the circumference of the edge of the (1-3)-the hole 345_3 inside the (1-3)-th hole 345_3. Accordingly, the red semiconductor light emitting device 150_R is not eccentrically provided, but correctly positioned in the (1-3)-th hole 345-3.

As illustrated in FIGS. 18A to 18C, FIGS. 20A to 20C, and FIGS. 22A and 22B, some of different semiconductor light emitting devices, which do not correspond to the (1-1)-th hole 345_1, the (1-2)-th hole 345_2, and the (1-3)-th hole 345_3, may be positioned in the (1-1)-th hole 345_1, the (1-2)-th hole 345_2, and the (1-3)-th hole 345_3, respectively.

Figure 18A:
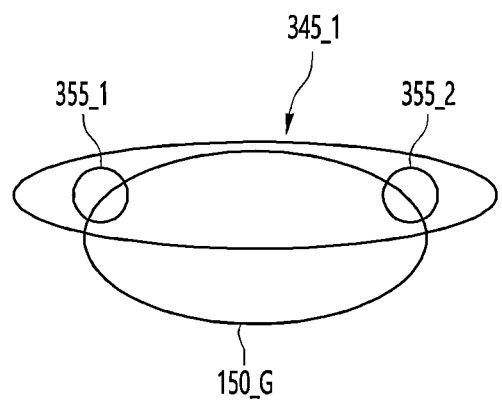
FIGS. 18A to 18C show different semiconductor light emitting devices erroneously assembled to a first assembling hole, instead of a blue semiconductor light emitting device.
Figure 18B:
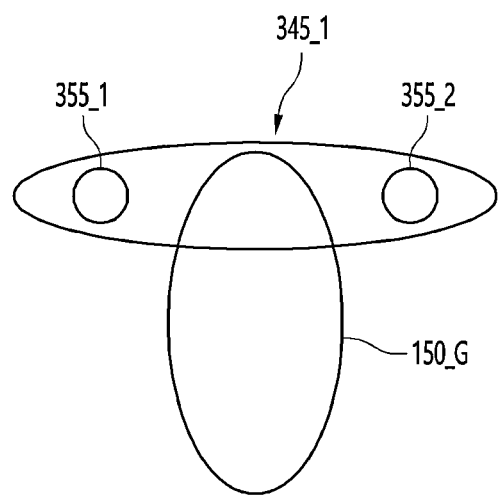
Figure 18C:
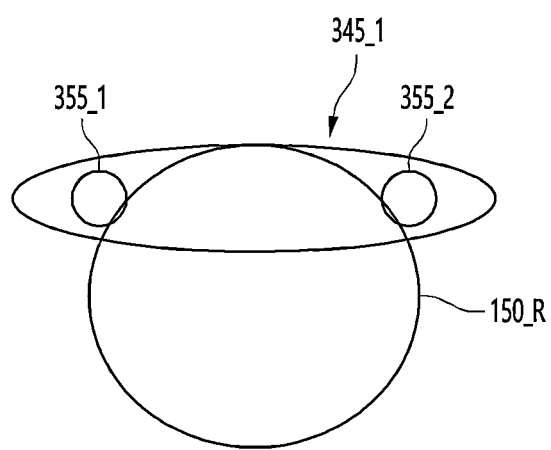

As illustrated in FIGS. 18A and 18B, a portion of the green semiconductor light emitting device 150_G having the less elongated oval shape may be positioned above the (1-1)-th hole 345-1 having the shape corresponding to the elongated oval shape of the blue semiconductor light emitting device 150_B. As illustrated in FIG. 18C, a portion of the red semiconductor light emitting device 150_R having the circular shape may be positioned above the (1-1)-th hole 345_1 having the shape corresponding to the elongated oval shape of the blue semiconductor light emitting device 150_B.

As described above, since the electric field is intensively distributed in the (2-1)-th hole 355_1 and the (2-2)-th hole 355_2 in the self-assembling, the greater dielectrophoretic force may be formed in the (2-1)-th hole 355_1 and the (2-2)-th hole 355_2. However, a portion of the green semiconductor light emitting device 150_G and a portion of the red semiconductor light emitting device 150_R are all not overlapped with the (2-1)-th hole 355_1 and the (2-2)-th hole 355_2 positioned in the (1-1)-th hole 345_1 in the vertical direction. The portion of the green semiconductor light emitting device 150_G and the portion of the red semiconductor light emitting device 150_R are all not assembled in the (1-1)-th hole 345-1. In addition, as illustrated in FIG. 16, since the strength of the electric field is weak or absent at the upper portion of the first hole 345 or above the upper portion of the first hole 345, the dielectrophoretic force is significantly weak or absent. Accordingly, the green semiconductor light emitting device 150_G or the red semiconductor light emitting device 150_R positioned on the (1-1)-th hole 345-1 moves to another place without staying on the (1-1)-the hole 345_1 for a long time. Therefore, only the blue semiconductor light emitting device 150_B having the shape corresponding to the shape of the (1-1)-the hole 345_1 is assembled to the (1-1)-the hole 345_1, thereby basically preventing the assembling failure.

As illustrated in FIGS. 19A and 19B, a portion of the blue semiconductor light emitting device 150_B having the elongated oval shape may be positioned above the (1-2)-th hole 345-2 having the shape corresponding to the less elongated oval shape of the green semiconductor light emitting device 150_G. As illustrated in FIG. 19C, a portion of the red semiconductor light emitting device 150_R having the circular shape may be positioned above the (1-2)-th hole 345_2 having the shape corresponding to the less elongated oval shape of the green semiconductor light emitting device 150_G.

Figure 20A:
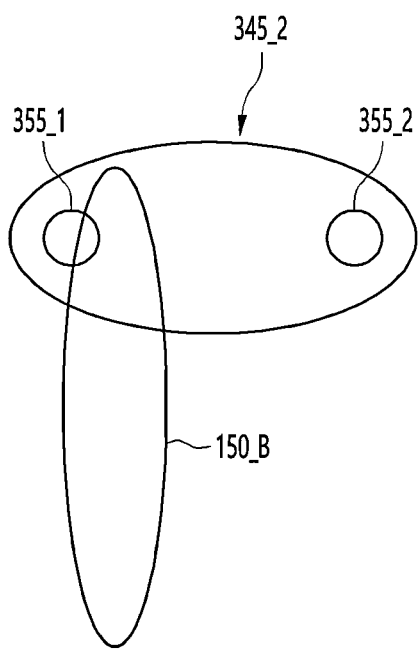
FIGS. 20A to 20C show different semiconductor light emitting devices erroneously assembled to a second assembling hole, instead of a green semiconductor light emitting device.
Figure 20B:
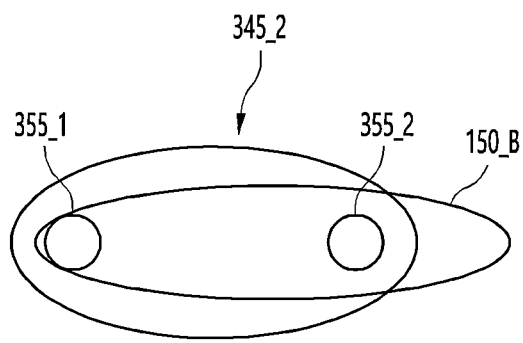
Figure 20C:
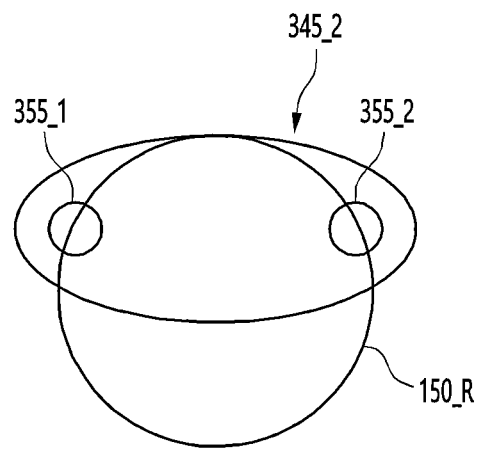

As described above, since the electric field is intensively distributed in the (2-1)-th hole 355_1 and the (2-2)-th hole 355_2 in the self-assembling, the greater dielectrophoretic force may be formed in the (2-1)-th hole 355_1 and the (2-2)-th hole 355_2. In addition, as illustrated in FIG. 16, since the strength of the electric field is weak or absent at the upper portion of the first hole 345 or above the upper portion of the first hole 345, the dielectrophoretic force is significantly weak or absent. Therefore, as illustrated in FIG. 20A to 20C, the dielectrophoretic force is weak or absent at a position, for example, position "b" or position "c" at which the blue semiconductor light emitting device 150_B or the red semiconductor light emitting device 150_R is positioned. Accordingly, the blue semiconductor light emitting device 150_B or the red semiconductor light emitting device 150_R are not able to be assembled to the (1-2)-th hole 345_2, and move to another place without staying on the (1-2)-th hole 345_2 for a long time. Therefore, the green semiconductor light emitting device 150_G having the shape corresponding to the shape of the (1-2)-th hole 345_2 is assembled to the (1-2)-th hole 345_2, thereby basically preventing the assembling failure.

As illustrated in FIGS. 21A and 21B, a portion of the blue semiconductor light emitting device 150_B having the elongated oval shape and a portion of the green semiconductor light emitting device 150_G having the less elongated oval shape may be positioned above the (1-3)-th hole 345_3 having the circular shape.

As described above, since the electric field is intensively distributed in the (2-1)-th hole 355_1 and the (2-2)-th hole 355_2 in the self-assembling, the greater dielectrophoretic force may be formed in the (2-1)-th hole 355_1 and the (2-2)-th hole 355_2. In addition, as illustrated in FIG. 16, since the strength of the electric field is weak or absent at the upper portion of the first hole 345 or above the upper portion of the first hole 345, the dielectrophoretic force is significantly weak or absent. Therefore, as illustrated in FIGS. 21A and 21B, the dielectrophoretic force is weak or absent at a position, for example, position "b" or position "c" at which the blue semiconductor light emitting device 150_B or the green semiconductor light emitting device 150_G is positioned. Accordingly, the blue semiconductor light emitting device 150_B or the green semiconductor light emitting device 150_G are not able to be assembled to the (1-3)-th hole 345_3, and move to another place without staying on the (1-3)-th hole 345_3 for a long time. Therefore, only the red semiconductor light emitting device 150_R having the shape corresponding to the shape of the (1-3)-th hole 345_3 is assembled to the (1-3)-th hole 345_3, thereby basically preventing the assembling failure.

The following description will be made regarding a display device manufactured through the following process to emit light from the semiconductor light emitting device 150 according to the first embodiment (see FIGS. 12 and 13).

Figure 23:
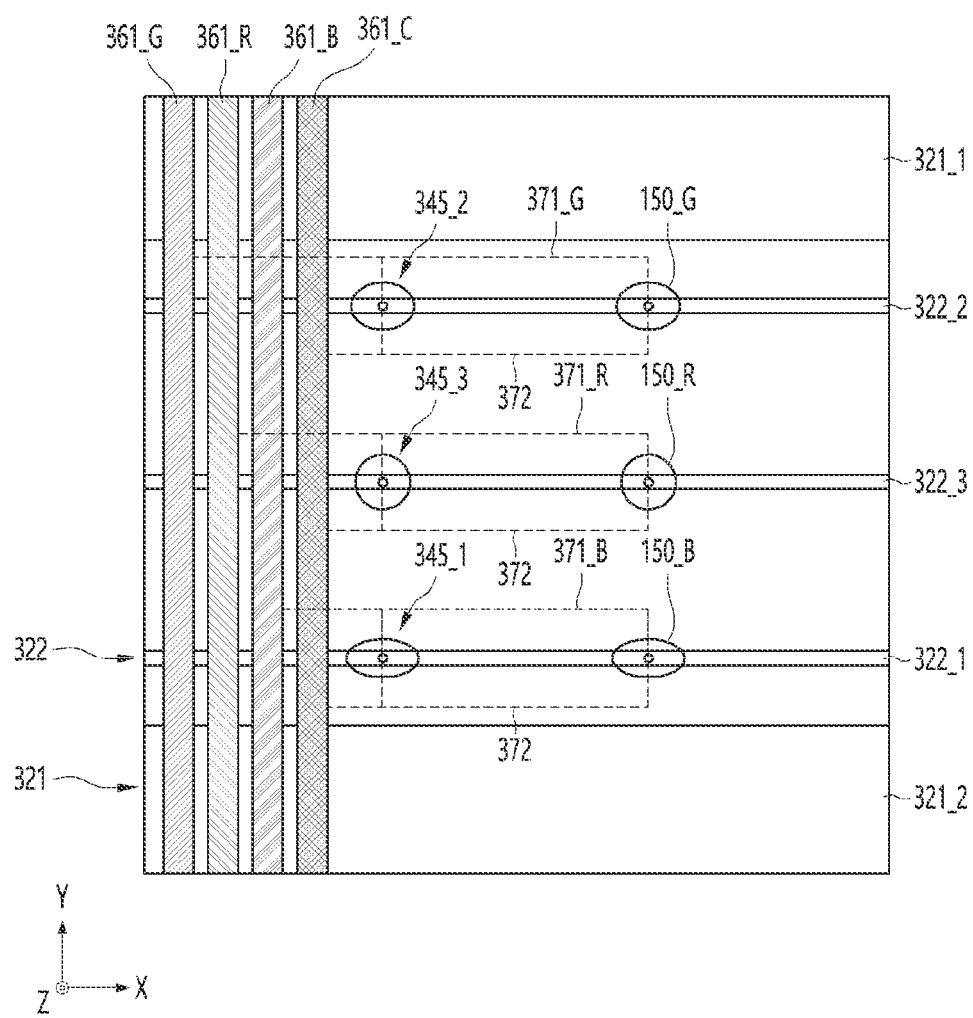
FIG. 23 is a plan view illustrating a display device manufactured through the following process, after assembling a semiconductor light emitting device in FIG. 12.
Figure 24:
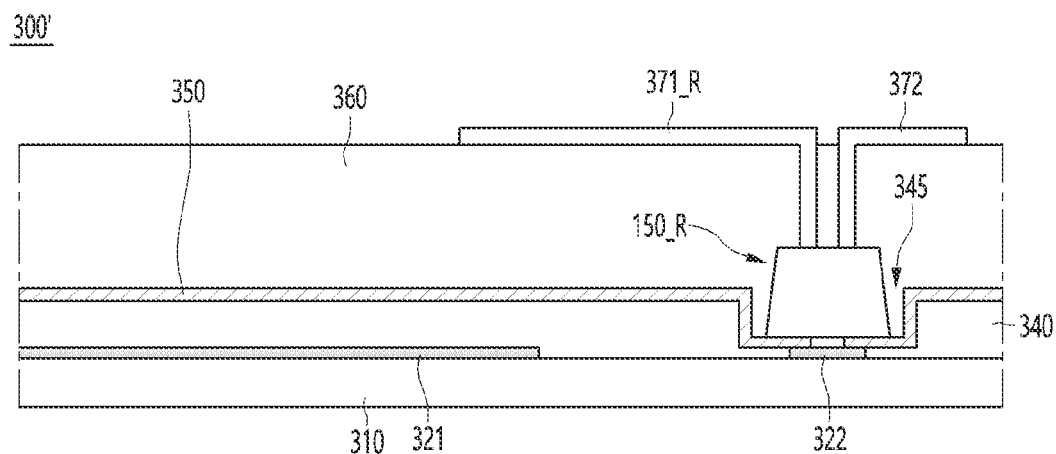
FIG. 24 is a cross-sectional view taken along line D-E of FIG. 23.

FIG. 23 is a plan view illustrating a display device manufactured through the following process, after assembling a semiconductor light emitting device in FIG. 12. FIG. 24 is a cross-sectional view taken along line D-E of FIG. 23.

As illustrated in FIGS. 12 and 13, the semiconductor light emitting device 150 may be assembled in the first hole 345 on the substrate 310 by performing the self-assembling process.

In detail, the blue semiconductor light emitting device 150_B may be disposed in each of a plurality of the (1-1)-the holes 345_1 on a (2-1)-th assembling wire 322-1, the green semiconductor light emitting device 150_G may be disposed in each of a plurality of (1-2)-th holes 345-2 on a (2-2)-th assembling wire 322_2, and the red semiconductor light emitting device 150_R may be disposed in a plurality of (1-3)-th holes 345-3 on the (2-3)-th assembling wire 322-3.

Referring to FIGS. 23 and 24, according to a first embodiment, a display device 300' may include a third insulating layer 360, first electrodes 371_B, 371_G, and 371_R, a second electrode wire 372, data lines 361_B, 361_G, and 361_R, and a common data wire 36-1_C.

The third insulating layer 360 may be disposed on the second insulating layer 350 and the semiconductor light emitting device 150.

The third insulating layer 360 may be disposed on a barrier 340. For example, the third insulating layer 360 may be disposed in the assembling hole 345 and on the semiconductor light emitting device 150, as well as the barrier 340.

The third insulating layer 360 may protect the semiconductor light emitting device 150. In other words, the third insulating layer 360 may protect the semiconductor light emitting device 150 from external moisture or foreign substances. The third insulating layer 360 may protect a first connecting part 350 from moisture or a conductive foreign substance.

The third insulating layer 360, which has a thicker thickness, may be planarization film to make the top surface thereof flat. Accordingly, first electrode wires 371_B, 371_G, and 371_R and a second electrode wire 372 or another insulating layer may be easily formed on the top surface of the third insulating layer 360.

For example, the third insulating layer 360 may include an inorganic material or an organic material. The third insulating layer 360 may include a resin material such as epoxy or silicone. The third insulating layer 360 may include a material having excellent light transmission such that light from the semiconductor light emitting device 150 is excellently transmitted.

Figure 2:
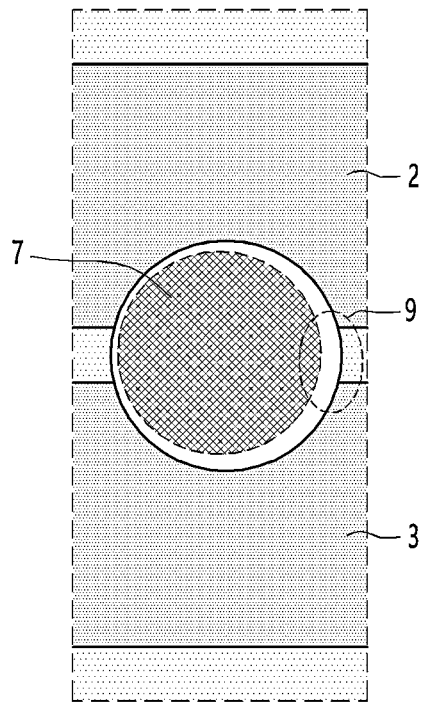
FIG. 2 shows the tolerance between an assembling hole and a semiconductor light emitting device.

The third insulating layer 360 may include distracting particles such that the light from the semiconductor light emitting device 150 is excellently distracted. For example, although the distracting particles are contained in the third insulating layer 360 corresponding to the semiconductor light emitting device 150 in each pixel PX (see FIG. 2), the embodiment is not limited thereto. The third insulating layer 360 may be formed in the entire portion of the substrate 310, regardless of sub-pixels (see reference signs PX1, PX2, and PX3 of FIG. 2).

The first electrode wires 371_B, 371_G, and 371_R and the second electrode wire 372 may be electrically connected with the semiconductor light emitting device 150 through the third insulating layer 360. As described above, the semiconductor light emitting device 150 may include the blue semiconductor light emitting device 150_B, the green semiconductor light emitting device 150_G, and the red semiconductor light emitting device 150_R. In this case, the second electrode wire 372 may be a common electrode wire connected with each of the blue semiconductor light emitting device 150_B, the green semiconductor light emitting device 150_G, and the red semiconductor light emitting device 150_R, in common.

For example, the blue electrode wire 371_B may be electrically connected with one side of the blue semiconductor light emitting device 150_B through the third insulating layer 360. The second electrode wire 372 may be electrically connected with an opposite side of the blue semiconductor light emitting device 150_B through the third insulating layer 360. For example, the green electrode wire 371_G may be electrically connected with one side of the green semiconductor light emitting device 150_G through the third insulating layer 360. The second electrode wire 372 may be electrically connected with an opposite side of the green semiconductor light emitting device 150_G through the third insulating layer 360. For example, the red electrode wire 371_R may be electrically connected with one side of the blue semiconductor light emitting device 150_R through the third insulating layer 360. The second electrode wire 372 may be electrically connected with an opposite side of the red semiconductor light emitting device 150_R through the third insulating layer 360.

In this case, one side or the opposite side may be varied depending on the type of the semiconductor light emitting device 150. Although drawings illustrate that the semiconductor light emitting device 150 is a lateral-type semiconductor light emitting device, the semiconductor light emitting device 150 may be a flip-chip type semiconductor light emitting device or the vertical-type semiconductor light emitting device. When the semiconductor light emitting device 150 is the lateral-type semiconductor light emitting device, the one side and the opposite side may be positioned at the upper portion the semiconductor light emitting device 150. For example, the first electrode wires 371_B, 371_G, and 371_R may be electrically connected with a portion of the top surface of a first conductive semiconductor layer of the semiconductor light emitting device 150, and the second electrode wire 372 may be electrically connected with a portion of the top surface of a second conductive semiconductor layer of the semiconductor light emitting device 150.

When the semiconductor light emitting device 150 is the vertical-type semiconductor light emitting device, the first electrode wires 371_B, 371_G, and 371_R may be electrically connected with a portion of the top surface of the first conductive semiconductor layer, and the second electrode wire 372 may be electrically connected with a bottom surface of the second conductive semiconductor layer of the semiconductor light emitting device 150. The first conductive semiconductor layer may include an N-type dopant, and the second conductive semiconductor layer may include a P-type dopant, but the embodiment is not limited thereto. In this case, a lower portion of the semiconductor light emitting device 150, that is, the first conductive semiconductor layer may be electrically connected with the second electrode wire 372 through an additional process. The second electrode wire 372 may be electrically connected with the second assembling wire 322 through the third insulating layer 360. Alternatively, the second electrode wire 372 may be electrically connected with a lateral side of the first conductive semiconductor layer of the semiconductor light emitting device 150 through the third insulating layer 360. Alternatively, a connection electrode may be disposed in a space in the first hole 345 other than the semiconductor light emitting device 150, and the second electrode wire 372 may be electrically connected with the connection electrode through the third insulating layer 360.

Meanwhile, data wires 361_B, 361_G, and 361_R may be electrically connected with the first electrode wires 371_B, 371_G, and 371_R, and a common data wire 361_C may be electrically connected with the second electrode wire 372.

The data wires 361_B, 361_G, and 361_R and the common data wire 361_C are disposed in the same layer, and the first electrode wires 371_B, 371_G, and 371_R and the second electrode wire 372 may be disposed in the same layer. For example, the data wires 361_B, 361_G, and 361_R and the first electrode wires 371_B, 371_G, and 371_R, which are disposed in mutually different layers, may be electrically connected with each other through a first contact hole. For example, the common data wire 361_C and the second electrode wire 372 may be disposed in mutually different layers, and may be electrically connected with each other through a first contact hole.

In detail, a fourth insulating layer (not illustrated) may be disposed on the first electrode wires 371_B, 371_G, and 371_R and the second electrode wire 372. The data wires 361_B, 361_G, and 361_R and the common data wire 361_C may be disposed on the fourth insulating layer. The first contact hole and the second contact hole may be formed in the fourth insulating layer. In this case, the data wires 361_B, 361_G, and 361_R may be electrically connected with the first electrode wires 371_B, 371_G, and 371_R through the first contact hole in the fourth insulating layer, and the common data wire 361_C may be electrically connected with the second electrode wire 372 through the second contact hole of the fourth insulating layer.

The data wires 361_B, 361_G, and 361_R may include a blue data wire 361_B, a green data wire 361_G, and a red data wire 361_R. In this case, the blue data wire 361_B may be electrically connected with the blue electrode wire 371_B, the green data wire 361_G may be electrically connected with the green electrode wire 371_G, and the red data wire 361_G may be electrically connected with the red electrode wire 371_G.

The blue data wire 361_B, the green data wire 361_G, and the red data wire 361_R may be disposed in parallel to each other. The blue data wire 361_B, the green data wire 361_G, and the red data wire 361_R may longitudinally extend in the Y-axis direction.

For example, the blue data wire 361_B, the green data wire 361_G, and the red data wire 361_R may be disposed to cross the first assembling wire 321 and the second assembling wire 322.

For example, the first electrode wires 371_B, 371_G, and 371_R may be disposed in parallel to the second electrode wire 372. For example, the first electrode wires 371_B, 371_G, and 371_R and the second electrode wire 372 may longitudinally extend in the X-axis direction. For example, the first electrode wires 371_B, 371_G, and 371_R and the second electrode wire 372 may be disposed in parallel to the first assembling wire 321 and the second assembling wire 322.

According to an embodiment, the first assembling wire 321 and the second assembling wire 322 may be provided to assemble the semiconductor light emitting device 150 to the first hole 345 using dielectrophoretic force. According to an embodiment, the data wires 361_B, 361_G, and 361_R, the common data wire 361_C, the first electrode wires 371_B, 371_G, and 371_R, and the second electrode wire 372 allow the blue semiconductor light emitting device 150_B, the green semiconductor light emitting device 150_G, and the red semiconductor light emitting device 150_R to individually emit light, and obtain mutually different brightness by adjusting a current intensity of each of the blue semiconductor light emitting device 150_B, the green semiconductor light emitting device 150_G, and the red semiconductor light emitting device 150_R.

The layout of the data wires 361_B, 361_G, and 361_R, the common data wire 361_C, the first electrode wires 371_B, 371_G, and 371_R, and second electrode wire 372 are provided only for the illustrative purpose, and various layouts may be designed.

Second Embodiment

Figure 25:
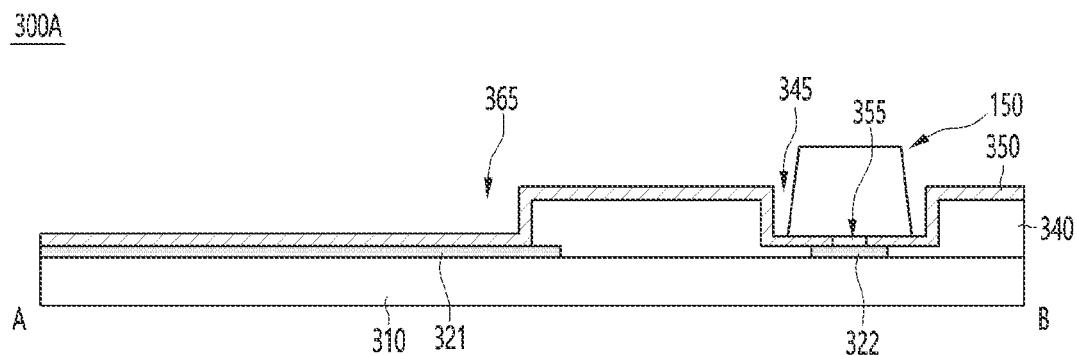
FIG. 25 is a sectional view illustrating a display device according to a second embodiment
Figure 26:
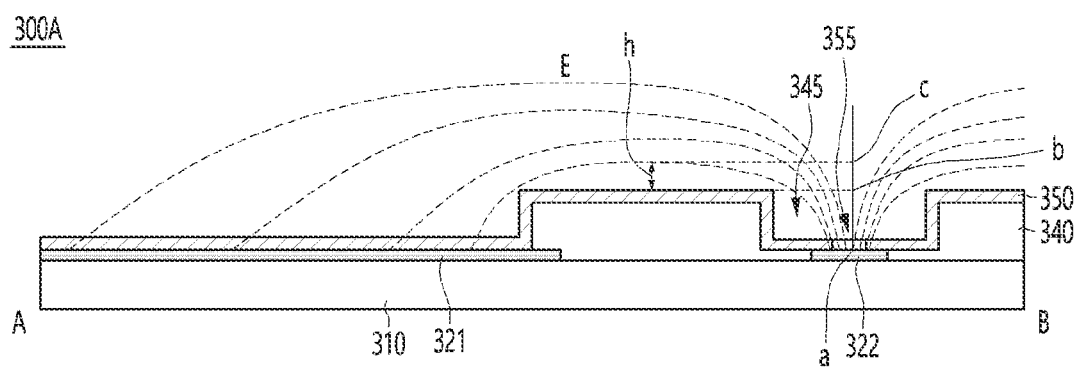
FIG. 26 shows the distribution of an electric field in self-assembling in a display panel according to the second embodiment.

FIG. 25 is a sectional view illustrating a display device according to a second embodiment. FIG. 26 illustrates the distribution of an electric field in the self-assembling in a display panel according to the second embodiment.

The second embodiment has the same as the first embodiment except for a third assembling hole 365. According to the second embodiment, components having the shape, the structure, and/or the function the same as those of the first embodiment will be assigned with the same reference numerals of those of the first embodiment, and the details thereof will be omitted below.

Referring to FIG. 25, according to the second embodiment, a display device 300A may include a substrate 310, a plurality of first assembling wires 321, a plurality of second assembling wires 322, a first insulating layer 340, a second insulating layer 350, a first hole 345, a second hole 355, a third hole 365, and a semiconductor light emitting device 150.

The first hole 345 may be formed in the first insulating layer 340 on the second assembling wire 322, and at least two second holes 355 may be formed in the second insulating layer 350 inside the first hole 345.

As illustrated in FIG. 16, the electric field is intensively distributed in at least two second holes 355 inside the first hole 345 on the second assembling wire 322, and the strength of the electric field is weak or absent at an upper portion, that is, position "b", or position "c" (see FIG. 26) of the first hole 345. Accordingly, the dielectrophoretic force is weak or absent.

Accordingly, only the semiconductor light emitting device 150 having the shape corresponding to the shape of the first hole 345 is assembled to the first hole 345, and the assembled semiconductor light emitting device 150 may be more firmly fixed by the greater dielectrophoretic force formed by the at last two second holes 355, thereby improving the assembling efficiency.

In addition, the semiconductor light emitting device 150 having the shape different from the shape of the first hole 345 is not assembled to the first hole 345, and the dielectrophoretic force is weak or absent above the first hole 345. Accordingly, the semiconductor light emitting device 150 may instantly move to another place, thereby preventing the assembling failure resulting caused by the repeated assembling.

Meanwhile, the third hole 365 may be formed in the first insulating layer 340 on the first assembling wire 321. The diameter of the third hole 365 may be less than the first width w1 (see FIG. 12) of the first assembling wire 321, but the embodiment is not limited thereto. In this case, the second insulating layer 350 may make contact with the first assembling wire 321.

The third hole 365 is formed in the first insulating layer 340 on the first assembling wire 321, and the second insulating layer 350 makes contact with the first assembling wire 321 in the third hole 365. Accordingly, even if the same voltage is applied to the first assembling wire 321 and the second assembling wire 322, the dielectrophoretic force greater than that of the first embodiment may be formed. The semiconductor light emitting device 150 may be more easily and exactly assembled to the first hole 345 by using the greater dielectrophoretic force.

Accordingly, the detailed description should be understood by way of example instead of being limitedly interpreted in terms of all aspects. The scope of the embodiment should be determined by the reasonable interpretation of attached claims, and the equivalents of the present disclosure falls within the scope of the embodiment.

The embodiment is applicable to a display field of displaying an image or information.

The embodiment is applicable to a display field of displaying an image or information by using a semiconductor light emitting device. The semiconductor light emitting device may be a micro-scale semiconductor light emitting device or a nano-scale semiconductor light emitting device.

What is claimed is:

1. A display device comprising:
   a plurality of first assembling wires on a substrate;
   a plurality of second assembling wires on the substrate;
   a first insulating layer disposed on the substrate, wherein a plurality of first holes are located on the plurality of second assembling wires, respectively;
   a second insulating layer disposed on the first insulating layer and the plurality of second assembling wires; and
   a semiconductor light emitting device, among a plurality of semiconductor light emitting devices, being located in a first hole among the plurality of first holes, the first hole being located on a second assembling wire among the plurality of second assembling wires, wherein a second hole is formed to expose the second assembling wire within the first hole.

2. The display device of claim 1, wherein the second hole has a diameter less than a second width of each of the plurality of second assembling wires.

3. The display device of claim 1, wherein the second hole has a diameter less than a diameter of the semiconductor light emitting device.

4. The display device of claim 1, wherein the second hole is provided in a plurality, and
   wherein at least two second holes are positioned in the first hole.

5. The display device of claim 1, wherein the second hole is provided in a plurality, and
   wherein at least four second holes are formed in the second insulating layer in the first hole, and along an edge of the first hole, when the first hole has a circular shape.

6. The display device of claim 1, wherein the second hole is provided in a plurality, and
   wherein at least two second holes are formed in the second insulating layer in the second hole to face each other in a direction of a major axis of the first hole, when the first hole has an oval shape.

7. The display device of claim 1, wherein the second hole is provided in a plurality, and
   wherein at least two second holes make contact with a bottom surface of the semiconductor light emitting device.

8. The display device of claim 1, wherein each of the plurality of first assembling wires makes contact with the second insulating layer.

9. The display device of claim 1, wherein the second hole has a thickness less than a thickness of the first insulating layer.

10. The display device of claim 1, wherein each of the plurality of second assembling wires has a second width less than a diameter of the first hole.

11. The display device of claim 1, wherein each of the plurality of second assembling wires has a second width less than a diameter of the semiconductor light emitting device.

12. The display device of claim 1, wherein each of the plurality of second assembling wires has a second width less than a first width of each of the plurality of first assembling wires.

13. The display device of claim 1, wherein a distance between each of the plurality of second assembling wires and each of the plurality of first assembling wires is greater than a diameter of the semiconductor light emitting device.

14. The display device of claim 1, wherein the first hole has a shape corresponding to a shape of the semiconductor light emitting device.

15. The display device of claim 1, wherein the plurality of first assembling wires and the plurality of second assembling wires are disposed in parallel to each other.

16. The display device of claim 1, wherein the plurality of first assembling wires are alternately aligned with the plurality of second assembling wires.

17. The display device of claim 1, wherein at least one second assembling wire is interposed between the plurality of first assembling wires.

18. The display device of claim 1, further comprising:
   a first electrode wire connected with a first side of the semiconductor light emitting device; and
   a second electrode wire connected with a second side of the semiconductor light emitting device.

19. The display device of claim 1, wherein the plurality of semiconductor light emitting devices include a blue semiconductor light emitting device, a green semiconductor light emitting device, and a red semiconductor light emitting device,
   wherein the plurality of first holes further include:
      a (1-1)-th hole formed on and exposing a top surface of a (2-1)-th wire of the plurality of second assembling wires, the blue semiconductor light emitting device being disposed in the (1-1)-th hole;

a (1-2)-th hole formed on and exposing the top surface of the (2-2)-th wire of the plurality of second assembling wires, the green semiconductor light emitting device being disposed in the (1-2)-th hole; and a (1-3)-th hole formed on and exposing the top surface of the (2-2)-th wire of the plurality of second assembling wires, the red semiconductor light emitting device being disposed in the (1-3)-th hole.

\* \* \* \* \*